(12) United States Patent
Ohnuma et al.

(10) Patent No.: US 8,236,668 B2
(45) Date of Patent: Aug. 7, 2012

(54) METHOD FOR MANUFACTURING SOI SUBSTRATE

(75) Inventors: Hideto Ohnuma, Kanagawa (JP);
Takashi Shingu, Kanagawa (JP);
Tetsuya Kakehata, Kanagawa (JP);
Kazutaka Kuriki, Kanagawa (JP);
Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 59 days.

(21) Appl. No.: 12/244,414

(22) Filed: Oct. 2, 2008

(65) Prior Publication Data
US 2009/0098739 A1 Apr. 16, 2009

(30) Foreign Application Priority Data
Oct. 10, 2007 (JP) ................ 2007-264983

(51) Int. Cl.
*H01L 21/30* (2006.01)
*H01L 21/46* (2006.01)
(52) U.S. Cl. ................ 438/458; 257/E21.211
(58) Field of Classification Search ........... 438/458; 257/E21.211
See application file for complete search history.

(56) References Cited

U.S. PATENT DOCUMENTS

| | | |
|---|---|---|
| 5,374,564 A | 12/1994 | Bruel |
| 5,528,397 A | 6/1996 | Zavracky et al. |
| 5,643,826 A | 7/1997 | Ohtani et al. |
| 5,670,411 A | 9/1997 | Yonehara et al. |
| 5,744,824 A | 4/1998 | Kousai et al. |
| 5,923,962 A | 7/1999 | Ohtani et al. |
| 6,020,252 A | 2/2000 | Aspar et al. |
| 6,110,845 A | 8/2000 | Seguchi et al. |
| 6,127,702 A | 10/2000 | Yamazaki et al. |
| 6,140,210 A | 10/2000 | Aga et al. |

(Continued)

FOREIGN PATENT DOCUMENTS
EP 651431 A2 5/1995
(Continued)

OTHER PUBLICATIONS

Sullivan, J et al., P-220L: Late-News Poster: Layer-Transfer of Silicon Single-Crystal Films on Large-Area Glass Substrates for Mobile Display Applications, SID Digest '06 : SID International Symposium Digest of Technical Papers, vol. 37, pp. 280-282.

(Continued)

*Primary Examiner* — Jarrett Stark
*Assistant Examiner* — John M Parker
(74) *Attorney, Agent, or Firm* — Fish & Richardson P.C.

(57) ABSTRACT

An object of the present invention is to provide a method for manufacturing an SOI substrate provided with a semiconductor layer which can be used practically even where a substrate having a low upper temperature limit such as a glass substrate is used. The manufacturing method compromises the steps of preparing a semiconductor substrate provided with a bonding layer formed on a surface thereof and a separation layer formed at a predetermined depth from the surface thereof, bonding the bonding layer to the base substrate having a distortion point of 700° C. or lower so that the semiconductor substrate and the base substrate face each other, and separating a part of the semiconductor substrate at the separation layer by heat treatment in order to form a single-crystal semiconductor layer over the base substrate. In the manufacturing method, a substrate which shrinks isotropically at least by the heat treatment is used as the base substrate.

42 Claims, 13 Drawing Sheets

U.S. PATENT DOCUMENTS

| | | |
|---|---|---|
| 6,191,007 B1 | 2/2001 | Matsui et al. |
| 6,225,192 B1 | 5/2001 | Aspar et al. |
| 6,261,957 B1 | 7/2001 | Jang et al. |
| 6,271,101 B1 | 8/2001 | Fukunaga |
| 6,285,042 B1 | 9/2001 | Ohtani et al. |
| 6,287,941 B1 | 9/2001 | Kang et al. |
| 6,335,231 B1 | 1/2002 | Yamazaki et al. |
| 6,335,541 B1 | 1/2002 | Ohtani et al. |
| 6,372,609 B1 | 4/2002 | Aga et al. |
| 6,380,046 B1 | 4/2002 | Yamazaki |
| 6,388,652 B1 | 5/2002 | Yamazaki et al. |
| 6,475,072 B1 | 11/2002 | Canaperi et al. |
| 6,485,993 B2 | 11/2002 | Trezza et al. |
| 6,525,415 B2 | 2/2003 | Koyanagi et al. |
| 6,534,380 B1 | 3/2003 | Yamauchi et al. |
| 6,602,761 B2 | 8/2003 | Fukunaga |
| 6,653,209 B1 | 11/2003 | Yamagata |
| 6,677,222 B1 | 1/2004 | Mishima et al. |
| 6,686,623 B2 | 2/2004 | Yamazaki |
| 6,759,277 B1 | 7/2004 | Flores et al. |
| 6,778,164 B2 | 8/2004 | Yamazaki et al. |
| 6,803,264 B2 | 10/2004 | Yamazaki et al. |
| 6,803,296 B2 | 10/2004 | Miyairi |
| 6,809,009 B2 | 10/2004 | Aspar et al. |
| 6,818,529 B2 | 11/2004 | Bachrach et al. |
| 6,849,877 B2 | 2/2005 | Yamazaki et al. |
| 6,875,633 B2 | 4/2005 | Fukunaga |
| 6,884,694 B2 | 4/2005 | Park et al. |
| 6,927,148 B2 | 8/2005 | Ito |
| 6,998,639 B2 | 2/2006 | Ohtani et al. |
| 7,029,950 B2 | 4/2006 | Yonehara et al. |
| 7,067,396 B2 | 6/2006 | Aspar et al. |
| 7,119,365 B2 | 10/2006 | Takafuji et al. |
| 7,148,124 B1 | 12/2006 | Usenko |
| RE39,484 E | 2/2007 | Bruel |
| 7,176,525 B2 | 2/2007 | Fukunaga |
| 7,179,719 B2 | 2/2007 | Droes et al. |
| 7,183,179 B2 | 2/2007 | Droes et al. |
| 7,199,024 B2 | 4/2007 | Yamazaki |
| 7,241,666 B2 | 7/2007 | Goto et al. |
| 7,253,032 B2 | 8/2007 | Yamazaki et al. |
| 7,256,776 B2 | 8/2007 | Yamazaki et al. |
| 7,262,088 B2 | 8/2007 | Kodaira et al. |
| 7,332,381 B2 | 2/2008 | Maruyama et al. |
| 7,332,412 B2 | 2/2008 | Park et al. |
| 7,354,844 B2 | 4/2008 | Endo et al. |
| 7,579,654 B2 | 8/2009 | Couillard et al. |
| 7,714,251 B2 | 5/2010 | Miyairi |
| 2002/0100941 A1 | 8/2002 | Yonehara et al. |
| 2002/0109144 A1 | 8/2002 | Yamazaki |
| 2004/0038505 A1 | 2/2004 | Ito et al. |
| 2004/0061176 A1 | 4/2004 | Takafuji et al. |
| 2004/0104424 A1 | 6/2004 | Yamazaki |
| 2004/0166651 A1 | 8/2004 | Aspar et al. |
| 2004/0238851 A1 | 12/2004 | Flores et al. |
| 2005/0009252 A1 | 1/2005 | Yamazaki et al. |
| 2005/0032283 A1 | 2/2005 | Itoga et al. |
| 2005/0042798 A1 | 2/2005 | Nagao et al. |
| 2005/0153524 A1 | 7/2005 | Maa et al. |
| 2006/0068563 A1 | 3/2006 | Wong et al. |
| 2006/0115961 A1 | 6/2006 | Aspar et al. |
| 2006/0118868 A1 | 6/2006 | Yoshimura et al. |
| 2006/0131583 A1 | 6/2006 | Ohtani et al. |
| 2006/0276004 A1 | 12/2006 | Dao |
| 2007/0048970 A1 | 3/2007 | Suzuki et al. |
| 2007/0063281 A1 | 3/2007 | Takafuji et al. |
| 2007/0087488 A1 | 4/2007 | Moriwaka |
| 2007/0108510 A1 | 5/2007 | Fukunaga |
| 2007/0141803 A1 | 6/2007 | Boussagol et al. |
| 2007/0173000 A1 | 7/2007 | Yamazaki |
| 2007/0184632 A1 | 8/2007 | Yamazaki et al. |
| 2007/0212853 A1 | 9/2007 | Maruyama et al. |
| 2007/0281440 A1 | 12/2007 | Cites et al. |
| 2007/0287242 A1 | 12/2007 | Kodaira et al. |
| 2007/0291022 A1 | 12/2007 | Yamazaki et al. |
| 2008/0061301 A1 | 3/2008 | Yamazaki |
| 2008/0063840 A1 | 3/2008 | Morita et al. |
| 2008/0067529 A1 | 3/2008 | Yamazaki |
| 2008/0067597 A1 | 3/2008 | Yamazaki |
| 2008/0083953 A1 | 4/2008 | Yamazaki |
| 2008/0246109 A1 | 10/2008 | Ohnuma et al. |
| 2008/0261376 A1 | 10/2008 | Yamazaki et al. |
| 2008/0261379 A1 | 10/2008 | Jinbo et al. |
| 2008/0268583 A1 | 10/2008 | Yamazaki et al. |
| 2008/0268615 A1* | 10/2008 | Allibert et al. ............... 438/455 |
| 2008/0286911 A1 | 11/2008 | Miyairi |
| 2008/0286939 A1 | 11/2008 | Ohnuma |
| 2008/0286952 A1 | 11/2008 | Miyairi et al. |
| 2008/0299743 A1 | 12/2008 | Miyairi |
| 2008/0318367 A1 | 12/2008 | Shimomura et al. |
| 2008/0318394 A1* | 12/2008 | Kakehata et al. ............ 438/458 |
| 2009/0004821 A1 | 1/2009 | Shimomura et al. |
| 2009/0004823 A1 | 1/2009 | Shimomura et al. |
| 2009/0017598 A1 | 1/2009 | Shimomura et al. |
| 2009/0039349 A1 | 2/2009 | Honda |
| 2009/0075456 A1 | 3/2009 | Akimoto et al. |
| 2009/0079024 A1 | 3/2009 | Yamazaki |

FOREIGN PATENT DOCUMENTS

| | | |
|---|---|---|
| EP | 1158580 A2 | 11/2001 |
| EP | 1635396 | 3/2006 |
| JP | 5335482 A | 12/1993 |
| JP | 7130652 A | 5/1995 |
| JP | 11097379 A | 4/1999 |
| JP | 11-163363 | 6/1999 |
| JP | 2000-124092 | 4/2000 |
| JP | 2003257804 | 9/2003 |
| JP | 2004087606 A | 3/2004 |
| JP | 2005203596 A | 7/2005 |
| JP | 2005252244 A | 9/2005 |
| WO | WO2007014320 A9 | 2/2007 |

OTHER PUBLICATIONS

Zehner, D et al., "Preparation of atomically clean silicon surfaces by pulsed laser irradiation,", Appl. Phys. Lett. (Applied Physics Letters), 1980, vol. 36, No. 1, pp. 56-59.

Kahlert, H et al., UV-Optics for Excimer Laser Based Crystallization Processes:, Mat. Res. Soc. Symp. Proc. (Materials Research Society Symposia Proceedings), 2001, vol. 685E, pp. D6.2.1-D6.2.6.

* cited by examiner after heat treatment

METHOD FOR MANUFACTURING SOI SUBSTRATE

BACKGROUND OF THE INVENTION

1. Field of the Invention

The present invention relates to an SOI (silicon on insulator) substrate. The present invention also relates to a semiconductor device manufactured using the SOI substrate.

2. Description of the Related Art

In recent years, integrated circuits using an SOI substrate where a thin single-crystal semiconductor layer is formed on an insulating surface, instead of a bulk silicon wafer, have been developed. Since parasitic capacitance between a drain of a transistor and a substrate is reduced by using the SOI substrate, the SOI substrate has been attracted attention as a substrate which improves performance of semiconductor integrated circuits.

A Smart Cut (registered trademark) method is known as one of methods for manufacturing an SOI substrate (e.g., see Reference 1: Japanese Published Patent Application No. 2000-124092). An outline of a method for manufacturing an SOI substrate by a Smart Cut method is described below. First, hydrogen ions are implanted into a silicon wafer by an ion implantation method in order to form an ion implantation layer at a predetermined depth from the surface. And then, the silicon wafer into which the hydrogen ions are implanted is bonded to another silicon water with a silicon oxide film interposed therebetween. After that, by heat treatment, the ion implantation layer is to be a cleavage plane, and the silicon wafer into which the hydrogen ions are implanted is separated as a thin film, whereby a silicon film can be formed over the silicon wafer which is bonded to the silicon wafer into which the hydrogen ions are implanted. A Smart Cut method may also be referred to as a hydrogen ion implantation separation method.

On the other hand, as an example of techniques of forming a single-crystal silicon thin film over a glass substrate by such a Smart Cut method, a technique disclosed by the present applicant is known (e.g., see Reference 2: Japanese Published Patent Application No. H11-163363).

SUMMARY OF THE INVENTION

A glass substrate, which is an inexpensive substrate and can be prepared with larger area than a silicon wafer, is mainly used for manufacturing a liquid crystal display device. By using a glass substrate as a base substrate, an inexpensive and large-sized SOI substrate can be manufactured. However, in the case where an SOI substrate is formed by bonding single-crystal silicon to a glass substrate with low heat resistance, which is used in a liquid crystal panel or the like, in order to reduce the substrate cost, there is a problem in that the glass substrate shrinks by heat treatment. In particular, when the glass substrate shrinks in certain directions, there is concern that sufficient characteristics can not be obtained due to defective bonding caused by distortion of a single-crystal silicon layer which is formed over the base substrate even where a transistor is manufactured using the single-crystal silicon layer.

In view of the above-described problem, an object of the present invention is to reduce an adverse effect due to defective bonding caused by shrink of a base substrate, or the like even where a substrate which has a low upper temperature limit such as a glass substrate is used as the base substrate in an SOI substrate.

One aspect of a method for manufacturing an SOI substrate according to the present invention comprises the steps of preparing a semiconductor substrate provided with a bonding layer formed on a surface thereof and a separation layer formed at a predetermined depth from the surface thereof, bonding the bonding layer to a base substrate having a distortion point of 700° C. or lower so that the semiconductor substrate and the base substrate face each other, and separating a part of the semiconductor substrate at the separation layer by heat treatment in order to form a single-crystal semiconductor layer over the base substrate. A substrate which shrinks isotropically at least by heat treatment is used as the base substrate. Note that the term "shrink" used herein means that a substrate shrinks by heat treatment. In addition, the phrase "shrink isotropically" used herein means that the shrinkage ratio of a surface which is parallel to a surface of a base substrate is the same or substantially the same in each of certain directions. The shrinkage ratio is preferably within ±10% of the average value (the average of the shrinkage ratios in certain directions).

Another aspect of a method for manufacturing an SOI substrate according to the present invention comprises the steps of preparing a semiconductor substrate provided with an insulating layer formed on a surface thereof, a bonding layer formed over the insulating layer, and a separation layer formed at a predetermined depth from the surface thereof, bonding the bonding layer to a base substrate having a distortion point of 700° C. or lower so that the semiconductor substrate and the base substrate face each other, and separating a part of the semiconductor substrate at the separation layer by heat treatment in order to form a single-crystal semiconductor layer over the base substrate. A substrate which shrinks isotropically at least by heat treatment is used as the base substrate.

Another aspect of a method for manufacturing an SOI substrate according to the present invention is to use a silicon oxide film which is formed by a chemical vapor deposition method using an organosilane gas as an insulating layer and is to use a nitrogen-containing layer as a bonding layer in the above-described structure.

Another aspect of a method for manufacturing an SOI substrate according to the present invention comprises the steps of preparing a semiconductor substrate provided with a bonding layer formed on a surface thereof and a separation layer formed at a predetermined depth from the surface thereof, bonding the bonding layer to an insulating layer formed over a base substrate having a distortion point of 700° C. or lower so that the surface of the semiconductor substrate and the surface of the base substrate face each other, and separating a part of the semiconductor substrate at the bonding layer by heat treatment in order to form a single-crystal semiconductor layer over the base substrate. A substrate which shrinks isotropically by heat treatment is used as the base substrate. In this case, a silicon oxide film which is formed by a chemical vapor deposition method using an organosilane gas can be used as the bonding layer, and a nitrogen-containing layer can be used as the insulating layer.

Another aspect of a method for manufacturing an SOI substrate according to the present invention is that heat treatment is performed at a temperature ranging from 400° C. or higher to 700° C. or lower in the above-described structure.

Another aspect of a method for manufacturing an SOI substrate according to the present invention is to use a substrate whose thermal expansion coefficient is the same as or substantially the same as, or larger than the thermal expansion coefficient of the semiconductor substrate as the base substrate in the above-described structure. For example, the thermal expansion coefficient of the base substrate can be 0.85 times to twice as high as the thermal expansion coefficient of the semiconductor substrate. In this case, a silicon substrate can be used as the semiconductor substrate, and a substrate whose thermal expansion coefficient is in the range of from $2.3 \times 10^{-6}$ to $5.0 \times 10^{-6}/°$ C. can be used as the base substrate. Note that the term "thermal expansion coefficient" used herein means a ratio of expansion in length and volume of an object as the result of an increase in the temperature of the object with respect to 1 K (° C.).

Another aspect of a method for manufacturing an SOI substrate according to the present invention is to use a glass substrate as the base substrate in the above-described structure. A mean surface roughness (Ra) of the glass substrate is preferably 0.3 nm or less. A glass substrate of which a surface is polished may be used as the base substrate.

In this specification, a semiconductor device includes any device capable of functioning by utilizing semiconductor characteristics, electro-optical devices, semiconductor circuits, and electronic devices.

In this specification, a display device includes light-emitting devices and liquid crystal display devices. A light-emitting device includes light-emitting elements, and a liquid crystal display device includes liquid crystal elements. A light-emitting element includes an element of which luminance is controlled by a current or a voltage, and specifically includes inorganic EL (electroluminescent) elements, organic EL elements, and the like.

The present invention can reduce an adverse effect due to defective bonding caused by shrink of the base substrate, or the like even where a substrate which has a low upper temperature limit such as a glass substrate is used as a base substrate in an SOI substrate.

DETAILED DESCRIPTION OF THE INVENTION

Embodiment Mode

Figure 1A:
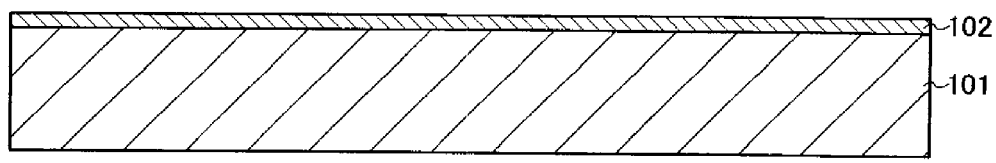
FIGS. 1A to 1D illustrate an example of a method for manufacturing an SOI substrate of the present invention.

Embodiment modes of the present invention are described below with reference to the drawings. Note that the present invention can be carried out in many different modes, and it will be readily appreciated by those skilled in the art that modes and details can be modified in various ways without departing from the sprit and scope of the present invention. Accordingly, the present invention should not be construed as being limited to the description of the embodiment modes to be given below. Note that in all of the drawings illustrating the embodiment modes, the same portions or portions having a similar function are denoted by the same reference numerals, and repetitive description thereof is omitted.

(Embodiment Mode 1)

This embodiment mode describes an example of a method for manufacturing an SOI substrate with reference to the drawings.

First, a semiconductor substrate 101 is prepared, and an insulating layer 102 is formed on a surface of the semiconductor substrate 101 (see FIG. 1A).

As the semiconductor substrate 101, a commercial semiconductor substrate can be used; for example, a single-crystal silicon substrate, a single-crystal germanium substrate, and a compound semiconductor substrate of gallium arsenide, indium phosphide, or the like can be used. Typically, sizes of the commercial silicon substrates are 5 in. (125 mm), 6 in. (150 mm), 8 in. (200 mm), and 12 in. (300 mm) in diameter and shapes of the commercial silicon substrates are circular. Note that the shape of the commercial silicon substrate is not limited to the circular shape, and a silicon substrate which is processed into a rectangular shape or the like can be used.

An insulating layer having a smooth surface is preferably used as the insulating layer 102, and a silicon oxide layer is suitable as the insulating layer 102. The surface of the silicon oxide layer is preferably set as follows: a mean surface roughness (Ra) is 0.5 nm or less and a root-mean-square roughness (Rms) is 0.6 nm or less; more preferably, Ra is 0.3 nm or less and Rms is 0.4 nm or less.

In particular, a silicon oxide layer which is manufactured by a chemical vapor deposition method using organosilane is preferable. This is because the surface of the insulating layer 102 can be planarized by using a silicon oxide layer which is formed using organosilane.

As examples of organosilane, which can be used include silicon-containing compounds such as tetraethoxysilane (abbreviation: TEOS) (chemical formula: $Si(OC_2H_5)_4$), tetramethylsilane (TMS) (chemical formula: $Si(CH_3)_4$), trimethylsilane (($CH_3)_3SiH$), tetramethylcyclotetrasiloxane (TMCTS), octamethylcyclotetrasiloxane (OMCTS), hexamethyldisilazane (HMDS), triethoxysilane ($SiH(OC_2H_5)_3$), and trisdimethylaminosilane ($SiH(N(CH_3)_2)_3$) can be used.

Here, a silicon oxide layer which is deposited by a chemical vapor deposition method using organosilane as a source gas is formed over the semiconductor substrate 101. Alternatively, a silicon oxide layer or a silicon oxynitride layer which is deposited by a chemical vapor deposition method using silane as a source gas can be employed.

Figure 1B:
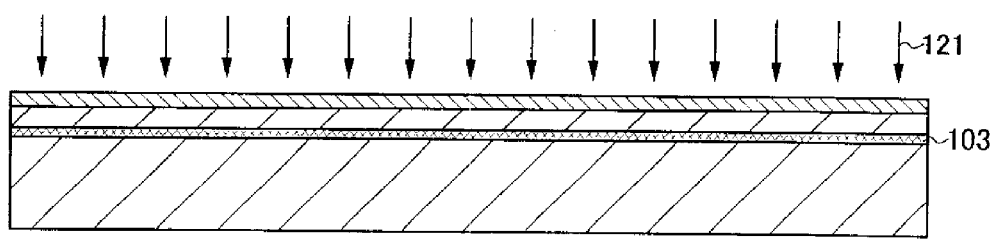

And then, the semiconductor substrate 101 is irradiated with an ion beam 121 including ions accelerated by an electric field through the insulating layer 102, whereby a separation layer 103 is formed in a region it a predetermined depth from the surface of the semiconductor substrate 101 (see FIG. 1B). In order to generate the ion beam 121, the source gas is excited to generate plasma of the source gas, and then ions included in plasma are extracted from plasma by an action of the electric field.

The depth of the region where the separation layer 103 is formed can be controlled by the acceleration energy of the ion beam 121 and the incidence angle of the ion beam 121. The acceleration energy can be controlled by an acceleration voltage, a dosage, or the like. The separation layer 103 is formed in a region at a depth substantially the same as the average penetration depth of ions. The thickness of a semiconductor layer which is to be separated from the semiconductor substrate 101 is determined in accordance with the depth of addition of ions. The thickness of the separation layer 103 is in the range of greater than or equal to 10 nm and less than or equal to 500 nm, and the depth is preferably in the range of greater than or equal to 50 nm and less than or equal to 200 nm.

In order to add ions to the semiconductor substrate 101, an ion implantation method in which mass separation is performed may be employed, or an ion doping method in which mass separation is not performed may be employed.

In the case where hydrogen ($H_2$) is used as a source gas, plasma including $H^+$ ions, $H_2^+$ ions, and $H_3^+$ ions can be produced by exciting a hydrogen gas. The proportion of ion species generated from the source gas can be changed by adjusting a plasma excitation method, pressure in an atmosphere for generating plasma, the amount of supplying the source gas, and the like. The proportion of $H_3^+$ ions which is included in the ion beam 121 is preferably 50% or higher with respect to the total amount of $H^+$ ions, $H_2^+$ ions, and $H_3^+$ ions; more preferably, the proportion of $H_3^+$ ions is 80% or higher.

$H_3^+$ ions contain more hydrogen atoms than other hydrogen ion species ($H^+$ ions and $H_2^+$ ions), and as a result, the mass of $H_3^+$ ions is large. Thus, in the case where $H^+$ ions, $H_2^+$ ions, and $H_3^+$ ions are accelerated by the same energy, $H_3^+$ ions are added to a region shallower than regions in the semiconductor substrate 101 where $H^+$ ions and $H_2^+$ ions are added. Therefore, by increasing the proportion of $H_3^+$ ions included in the ion beam 121, variation in the average penetration depth of hydrogen ions is decreased, and thus the hydrogen concentration profile in the depth direction of the semiconductor substrate 101 becomes steeper and the peak position of the profile can be shifted to a shallow region. Accordingly, the proportion of $H_3^+$ ions included in the ion beam 121 is preferably 50% or higher with respect to the total amount of $H^+$ ions, $H_2^+$ ions, and $H_3^+$ ions; more preferably, the proportion of $H_3^+$ ions is 80% or higher.

In the case where ions are added by an ion doping method using a hydrogen gas, the acceleration voltage can be set in the range of greater than or equal to 10 kV and less than or equal to 200 kV, and the dosage can be in the range of greater than or equal to $1\times10^{16}$ ions/cm$^2$ and less than or equal to $6\times10^{16}$ ions/cm$^2$. By adding hydrogen ions under these conditions, the separation layer 103 can be formed in a region at a depth ranging from 10 nm or more to 500 nm or less in the semiconductor substrate 101, although depending on the ion species included in the ion beam 121 and the proportion thereof.

Helium (He) can also be used as a source gas for the ion beam 121. Most of ion species which are produced by exciting helium are $He^+$ ions; therefore, $He^+$ ions can be added to the semiconductor substrate 101 as main ions even where an ion doping method in which mass separation is not performed is performed. Accordingly, microvoids can be efficiently formed in the separation layer 103 by an ion doping method. In the case where ions are added by an ion doping method using helium, the acceleration voltage can be set in the range of greater than or equal to 10 kV and less than or equal to 200 kV, and the dosage can be in the range of greater than or equal to $1\times10^{16}$ ions/cm$^2$ and less than or equal to $6\times10^{16}$ ions/cm$^2$.

A halogen gas such as a chlorine gas ($Cl_2$ gas) or a fluorine gas ($F_2$ gas) can be used as a source gas.

Figure 1C:
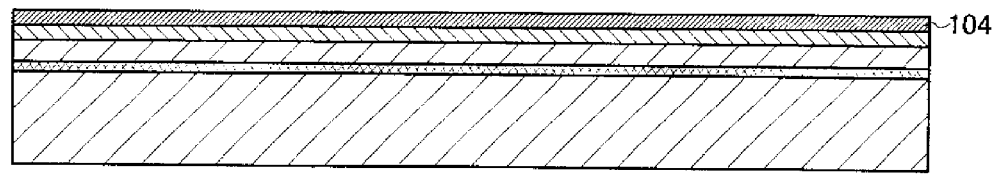

And then, a nitrogen-containing layer 104 is formed over the insulating layer 102 (see FIG. 1C).

The nitrogen-containing layer 104 serves as a layer which is to be bonded to a base substrate (a bonding layer). In addition, when a semiconductor layer having a single-crystal structure (hereinafter referred to as a "single-crystal semiconductor layer") is provided by bonding a part of the semiconductor substrate 101 to the base substrate in a later step, the nitrogen-containing layer 104 serves as a barrier layer which prevents impurities included in the base substrate such as mobile ions or moisture from being diffused into the single-crystal semiconductor layer.

The nitrogen-containing layer 104 is a film which at least contains nitrogen and silicon. For example, the nitrogen-containing layer 104 is formed to have a single layer structure or a stacked layer structure which includes any of a silicon nitride layer, a silicon nitride oxide layer, or a silicon oxynitride layer, for example, by a CVD method or the like. The nitrogen-containing layer 104 is formed in the range of greater than or equal to 10 nm and less than or equal to 200 nm; preferably the nitrogen-containing layer 104 is formed in the range of greater than or equal to 50 nm and less than or equal to 100 nm. In addition, an insulating layer having a smooth surface is preferably used for the nitrogen-containing layer 104 since the nitrogen-containing layer 104 serves as the bonding layer. It is preferable that the nitrogen-containing layer 104 be formed such that a mean surface roughness (Ra) is 0.5 nm or less and a root-mean-square roughness (Rms) is 0.6 nm or less; more preferably, Ra is 0.3 nm or less and Rms is 0.4 nm or less.

For example, a silicon nitride oxide layer which is deposited by a plasma CVD method at a low temperature (ranging from 100° C. or higher to 350° C. or lower; preferably ranging from 150° C. or higher to 300° C. or lower) is suitable as the nitrogen-containing layer 104. A silicon nitride oxide layer having a smooth surface can be obtained by forming the silicon nitride oxide layer by a plasma CVD method at a low temperature. Further, the amount of hydrogen (H) included in the nitrogen-containing layer 104 can be increased by forming the nitrogen-containing layer 104 at a low temperature, thereby strengthening bonding to the base substrate. In addition, the film formation at a low temperature can prevent the separation layer 103 which is formed in the semiconductor substrate 101 from being degassed. Note that a heat treatment temperature for separating the single-crystal semiconductor layer from the semiconductor substrate 101 is higher than the film formation temperature of the nitrogen-containing layer.

In this embodiment mode, a silicon oxide layer having a smooth surface is provided as the insulating layer 102, thereby planarizing a surface of the nitrogen-containing layer 104 which is formed over the insulating layer 102. Note that in the case where the semiconductor substrate 101 has a planarized surface, a structure in which the insulating layer 102 is not provided may be employed. For example, the nitrogen-containing layer 104 can be formed of a single layer selected from a silicon oxynitride layer or a silicon nitride oxide layer, or can be formed of a laminate of layers of a silicon oxynitride layer and a silicon nitride oxide layer which are stacked in that order over the semiconductor substrate 101.

In this specification, silicon oxynitride means a substance which contains more oxygen than nitrogen and, in the case where measurements are performed by rutherford backscattering spectrometry (RBS) and hydrogen forward scattering (HFS), preferably contains oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, silicon nitride oxide means a substance which contains more nitrogen than oxygen and, in the case where measurements are performed by RBS and HFS, preferably contains oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the above-described ranges, when the total number of atoms contained in the silicon oxynitride or the silicon nitride oxide is defined as 100 at. %.

Figure 1D:
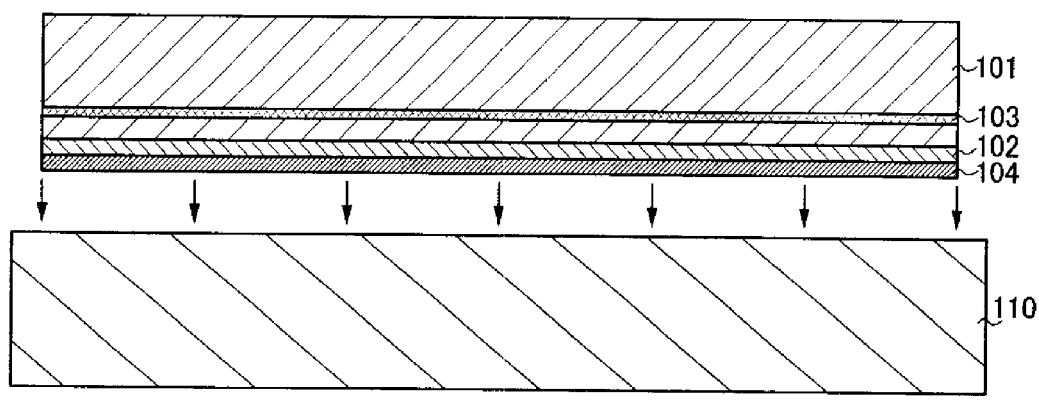

And then, the semiconductor substrate 101 and a base substrate 110 are bonded to each other (see FIG. 1D). The surface of the nitrogen-containing layer 104 serving as a bonding layer, which is formed over the semiconductor substrate 101, and a surface of the base substrate 110 are disposed in close contact with each other in order to form a bond. This bond is formed by van der Waals forces. The strong bond resulting from hydrogen bonding of Si—H or Si—OH can be formed by pressing the base substrate 110 and the semiconductor substrate 101 against each other.

Note that it is preferable that megasonic cleaning, or megasonic cleaning and ozone water cleaning be performed before the semiconductor substrate 101 and the base substrate 110 are bonded to each other since dust such as organic substances on the surfaces of the substrates can be removed and the surfaces of the substrates can be hydrophilic. Further, plasma treatment may be performed on the surface of the nitrogen-containing layer 104 to remove dust such as organic substances on a surface of the semiconductor substrate.

A substrate having an insulating surface is used as the base substrate 110. Specifically, a glass substrate used in the electronics industry such as an aluminosilicate glass substrate, an aluminoborosilicate glass substrate, or a barium borosilicate glass substrate can be used as the base substrate 110. A substrate having a distortion point of 700° C. or lower is used as the base substrate 110. For example, a glass substrate manufactured by ASAHI GLASS CO., LTD. (product name: AN 100) can be used as the base substrate 110.

Figure 13:
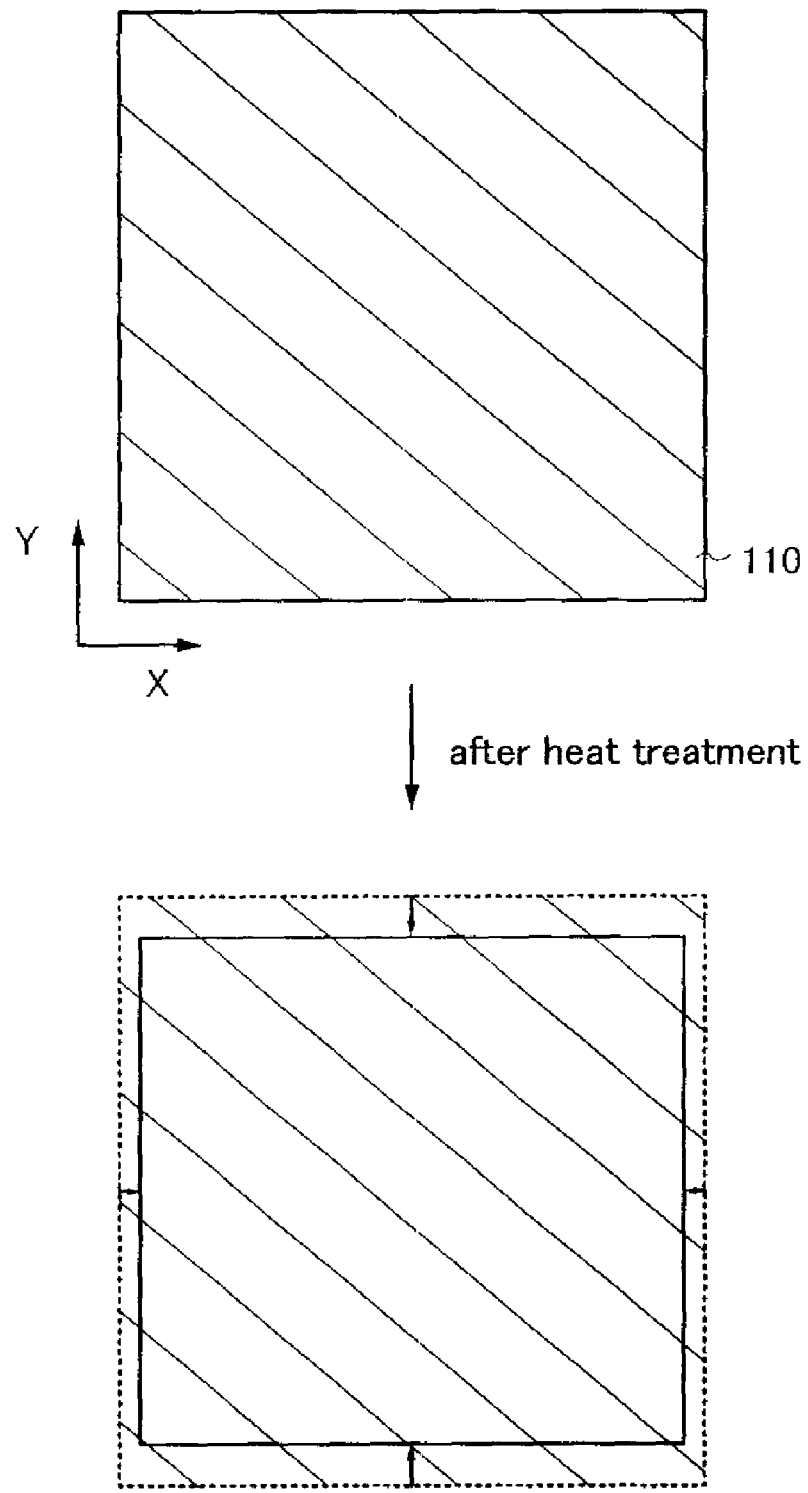
FIG. 13 illustrates shrink of a base substrate by heat treatment.

In general, in the case where an inexpensive glass substrate which can have a large area is used as the base substrate 110, cost reduction can be achieved. However, the glass substrate may shrink by heat treatment compared to the semiconductor substrate. In addition, the shrinkage ratio of the glass substrate may be different depending on methods for manufacturing the glass substrate and the like, and the shrinkage ratio of the glass substrate may be different depending on certain directions (see FIG. 13).

Thus, when heat treatment is performed after the semiconductor substrate 101 and the base substrate 110 are bonded to each other, in the case where the base substrate 110 shrinks differently (anisotropically) in each of certain directions, there is concern that distortion is caused to the single-crystal semiconductor layer formed over base substrate 110 as well in a certain direction. As a result, defective bonding is caused by generation of a stress in a certain direction. In the case where an element such as a transistor including the single-crystal semiconductor layer is formed, there is a possibility that element characteristics are adversely affected.

Therefore, in this embodiment mode, a substrate which shrinks isotropically by heat treatment without depending on certain directions is used as the base substrate 110. An occurrence of distortion of the single-crystal semiconductor layer formed over the base substrate 110 in a certain direction can be suppressed by using such a base substrate. Note that the phrase "shrink isotropically" used herein means that the shrinkage ratios of a surface which is parallel to the base substrate 110 are the same or substantially the same in each of certain directions. The shrinkage ratio of a surface which is parallel to the base substrate 110 is preferably within ±10% of the average value (the average of the shrinkage ratios in certain directions). For example, in the case where the average value of the shrinkage ratios is 150 ppm, the shrinkage ratios in each of certain directions (e.g., in the X-axis direction and in the Y-axis direction (a direction different by 90 degrees from the X-axis direction)) are in the range of from 135 ppm to 165 ppm.

Further, in this embodiment mode, a substrate whose thermal expansion coefficient is the same as or substantially the same as, or larger than a thermal expansion coefficient of the semiconductor substrate 101 is preferably used as the base substrate 110. By using such a base substrate, difference in stress between the semiconductor substrate 101 and the base substrate 110, which is caused by heat treatment, can be reduced, thereby preventing the semiconductor substrate 101 and the base substrate 110 from being peeled off. A thermal expansion coefficient of the base substrate 110 is preferably 0.85 times to twice as high as a thermal expansion coefficient of the semiconductor substrate 101. For example, in the case where a single-crystal silicon substrate is used as the semiconductor substrate 101, a thermal expansion coefficient of silicon is $2.6 \times 10^{-6}/°$ C. (up to 300° C.). Thus, a substrate whose thermal expansion coefficient is in the range of from $2.3 \times 10^{-6}$ to $5.0 \times 10^{-6}/°$ C. (up to 300° C.) is preferably used as the base substrate 110 (e.g., a glass substrate).

In addition, it is preferable that the base substrate 110 have a smooth surface. The surface of the base substrate 110 is preferably set as follows: a mean surface roughness (Ra) is 0.5 nm or less and a root-mean-square roughness (Rms) is 0.6 nm or less; more preferably, Ra is 0.3 nm or less and Rms is 0.4 nm or less. For example, in the case where a glass substrate is used as the base substrate 110, polishing treatment may be performed on a surface of the glass substrate in advance.

By using a glass substrate as the base substrate 110, for example, a large-sized mother glass called "the sixth generation" (1500 mm×1850 mm), "the seventh generation" (1870 mm×2200 mm), or "the eighth generation (2200 mm×2400 mm) can be used. A large-sized mother glass is used as the base substrate 110 and the base substrate 110 is bonded to a plurality of semiconductor substrates to manufacture an SOI substrate so that the SOI substrate can have a large area. As a result, the number of display panels which is manufactured from one substrate (panels yielded per substrate) can be increased, thereby improving productivity.

In order to favorably bond the base substrate 110 to the nitrogen-containing layer 104, bonding surfaces may be activated. For example, one or both of the surfaces on which the bond is formed is irradiated with an atomic beam or an ion beam. In the case of utilizing the atomic beam or the ion beam, an inert gas neutral atomic beam or an inert gas ion beam of argon or the like can be used. In addition, the bonding surfaces may be activated by performing plasma irradiation or radical treatment. Such a surface treatment facilitates forming a bond between different materials even at a temperature of 400° C. or lower.

After the base substrate 110 is bonded to the semiconductor substrate 101 with the nitrogen-containing layer 104 interposed therebetween (see FIG. 2A), it is preferable that one or both of heat treatment and pressure treatment be performed. By performing heat treatment or pressure treatment, bonding strength between the base substrate 110 and the semiconductor substrate 101 can be improved. The heat treatment is performed at a temperature lower than or equal to the upper temperature limit of the base substrate 110. For example, the heat treatment may be performed at 200° C. in this embodiment mode. The pressure treatment is performed such that pressure is applied to the bonding surface in a perpendicular direction in consideration of the pressure resistance of the base substrate 110 and the semiconductor substrate 101.

Figure 2A:
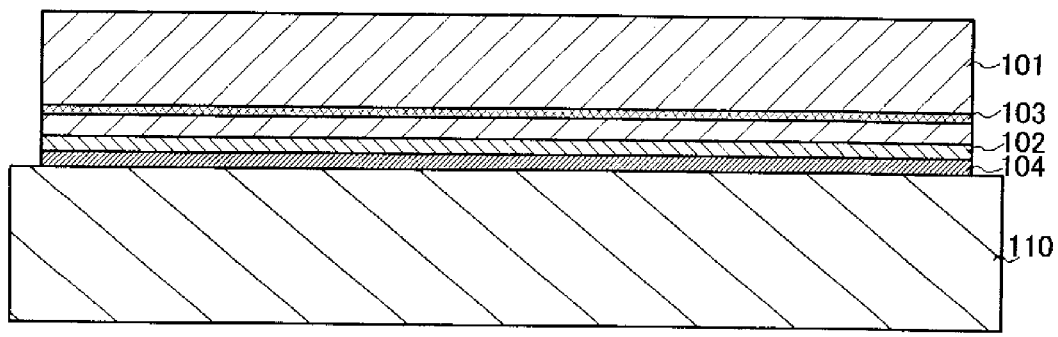
FIGS. 2A and 2B illustrate an example of a method for manufacturing an SOI substrate of the present invention.
Figure 2B:
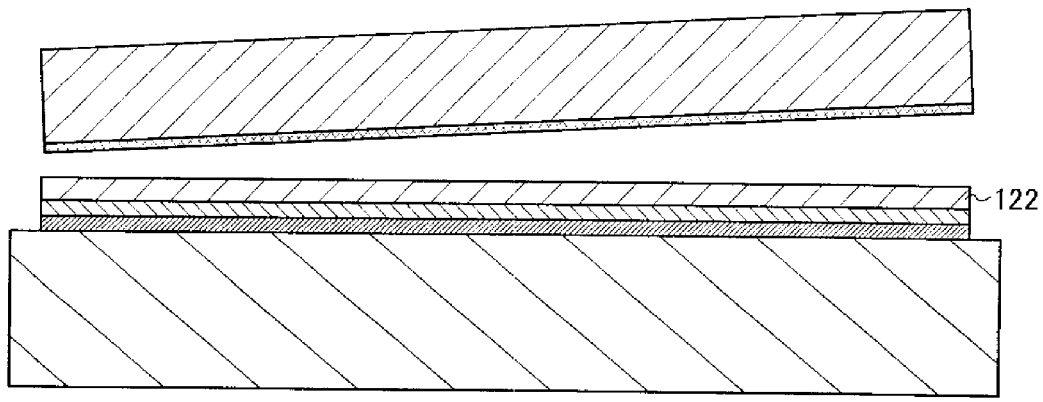

And then, heat treatment is performed to separate a part of the semiconductor substrate 101 from the base substrate 110 with the separation layer 103 used as a cleavage plane (see FIG. 2B). The heat treatment temperature is preferably higher than or equal to the film formation temperature of the insulating layer 102 and is also preferably lower than or equal to the upper temperature limit of the base substrate 110. For example, the heat treatment is performed at a temperature ranging from 400° C. to 700° C., whereby the volume of the microvoids formed in the separation layer 103 is changed, and thus cleavage is performed along the separation layer 103. Since the insulating layer 102 is bonded to the base substrate 110, a single-crystal semiconductor layer 122 having the same crystallinity as the semiconductor substrate 101 is left over the base substrate 110. Note that in the case of using a rapid thermal anneal (RTA) apparatus or the like which can perform rapid heating for the heat treatment, the heat treatment may be performed at a temperature higher than a distortion point of the base substrate 110.

Through the above steps, an SOI substrate where the single-crystal semiconductor layer 122 is provided over the base substrate 110 with the insulating layer 102 and the nitrogen-containing layer 104 interposed therebetween can be obtained.

Although in this embodiment mode, heat treatment is preformed in FIGS. 2A and 2B, as described above, the base substrate 110 can be prevented from shrinking in certain directions by using a substrate which shrinks isotropically by heat treatment as the base substrate 110. As a result, distortion which is caused in the single-crystal semiconductor layer 122 provided over the base substrate 110 in a certain direction after separation can be reduced.

Note that a method for manufacturing an SOI substrate, which is described in this embodiment mode, is not limited to the above-described method. For example, the separation layer 103 may be formed in a region at a predetermined depth from the surface of the semiconductor substrate 101 as follows: ions such as hydrogen ions are introduced into the semiconductor substrate 101 through the insulating layer 102 and the nitrogen-containing layer 104 after forming the nitrogen-containing layer 104, not before forming the nitrogen-containing layer 104. A surface layer of the nitrogen-containing layer 104 is etched after ions are introduced, and then ions are added thereto, whereby a damaged layer formed on the surface of the nitrogen-containing layer 104 may be removed.

Further, silane is adsorbed on the surface of the nitrogen-containing layer 104 after ions are introduced into the semiconductor substrate 101 through the nitrogen-containing layer 104, and then the surface of the nitrogen-containing layer 104 is exposed to the atmosphere, whereby a thin oxide film (e.g., SiOx) may be formed over the nitrogen-containing layer 104. In this case, the surface of the nitrogen-containing layer 104 can be hydrophilic after the ions are introduced, and the bonding with the base substrate 110 can be strengthened. Note that the bonding surface may be activated by performing plasma irradiation or radical treatment on the surface after the oxide film is formed.

In addition, ions such as hydrogen ions may be introduced into the semiconductor substrate 101 before forming the insulating layer 102, not after forming the insulating layer 102, in order to form the separation layer 103 at a predetermined depth from the surface of the semiconductor substrate 101.

Note that in this case, it is preferable that a protective layer be formed over the semiconductor substrate 101 and ions be introduced through the protective layer in order to prevent impurities and the like from attaching to the surface of the semiconductor substrate 101 due to ion introduction and to prevent the surface of the semiconductor substrate 101 from being etched due to ion introduction.

As the protective layer, for example, an oxide film which is obtained by performing treatments on the surface of the semiconductor substrate 101 with ozone water, a hydrogen peroxide solution, and a sulfuric acid/hydrogen peroxide mixture in an ozone atmosphere can be used. In addition, an oxide film which is obtained by performing oxidation in which halogen (e.g., chlorine) is added in an oxidizing atmosphere can be used as the protective layer. In the case where a halogen element is included in an oxide film, the oxide film can serve as a protective layer which captures impurities such as metals and prevents the semiconductor substrate 101 from being contaminated.

After that, the insulating layer 102 and the nitrogen-containing layer 104 may be formed over the protective layer formed over the semiconductor substrate 101, or the insulating layer 102 and the nitrogen-containing layer 104 may be formed over the semiconductor substrate 101 after the protective layer is removed after ion introduction. In addition, the protective layer may be bonded to the base substrate 110 as a bonding layer without providing the nitrogen-containing layer 104.

A method for manufacturing an SOI substrate described in this embodiment mode can be combined with manufacturing methods described in other embodiment modes in this specification, as appropriate.

(Embodiment Mode 2)

This embodiment mode describes a method for manufacturing an SOI substrate, which is different from that in the above-described embodiment mode, with reference to the drawings. Specifically, a manufacturing method in which a base substrate provided with a nitrogen-containing layer on a surface thereof and a semiconductor substrate are bonded to each other is described.

Figure 3A:
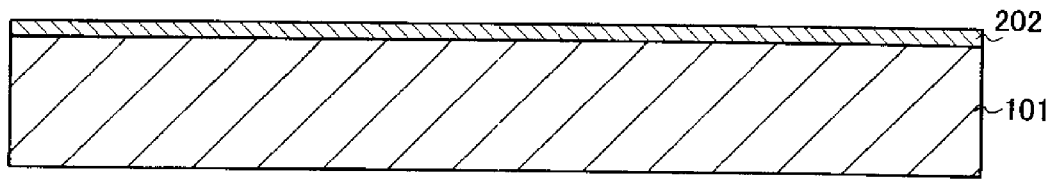
FIGS. 3A to 3C illustrate an example of a method for manufacturing an SOI substrate of the present invention.

First, the semiconductor substrate 101 is prepared, and then an insulating layer 202 is formed on the surface of the semiconductor substrate 101 (see FIG. 3A).

In this embodiment mode, the insulating layer 202 which serves as a bonding layer to be bonded to the base substrate is provided on a surface where a bond is formed between the semiconductor substrate 101 and the base substrate. The insulating layer 202 may have a single layer structure or a stacked layer structure, and an insulating layer of which a surface to be bonded to the base substrate (hereinafter also referred to as a "bonding surface") is a smooth surface and is to be a hydrophilic surface is preferably used. A silicon oxide layer is suitable as the insulating layer which has a smooth surface and can form a hydrophilic surface. The surface of the silicon oxide layer is preferably set as follows: a mean surface roughness (Ra) is 0.5 nm or less and a root-mean-square roughness (Rms) is 0.6 nm or less; more preferably, Ra is 0.3 nm or less and Rms is 0.4 nm or less.

In particular, a silicon oxide layer which is manufactured by a chemical vapor deposition method using organosilane is preferable. This is because by using the silicon oxide layer formed using organosilane, the bonding between a base substrate and a single-crystal semiconductor layer can be strengthened.

Examples of organosilane which can be used include silicon-containing compounds such as tetraethoxysilane (abbreviation: TEOS) (chemical formula: $Si(OC_2H_5)_4$), tetramethylsilane (TMS) (chemical formula: Si(CH$_3$)$_4$), trimethylsilane ((CH$_3$)$_3$SiH), tetramethylcyclotetrasiloxane (TMCTS), octamethylcyclotetrasiloxane (OMCTS), hexamethyldisilazane (HMDS), triethoxysilane (SiH(OC$_2$H$_5$)$_3$), and trisdimethylaminosilane (SiH(N(CH$_3$)$_2$)$_3$).

Here, a silicon oxide layer which is deposited by a chemical vapor deposition method using organosilane as a source gas is formed over the semiconductor substrate 101. Alternatively, a silicon oxide layer or a silicon oxynitride layer which is deposited by a chemical vapor deposition method using silane as a source gas can be employed. When film formation is performed by a chemical vapor deposition method, a temperature low enough to prevent the separation layer 103 formed in the semiconductor substrate 101 from being degassed is employed. For example, the film formation temperature is preferably 350° C. or lower. Note that heat treatment in which the single-crystal semiconductor layer is separated from the semiconductor substrate 101 is performed at a temperature higher than the film formation temperature using a chemical vapor deposition method.

Figure 3B:
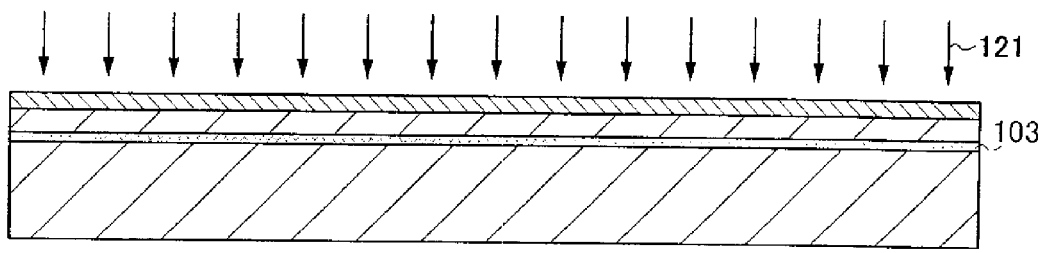

And then, the semiconductor substrate 101 is irradiated with an ion beam 121 including ions accelerated by an electric field through the insulating layer 202 in order to form a separation layer 103 in a region at a predetermined depth from the surface of the semiconductor substrate 101 (see FIG. 3B). The detailed description of a method for forming the separation layer 103 is omitted here, since Embodiment Mode 1 can be referred to.

Figure 3C:
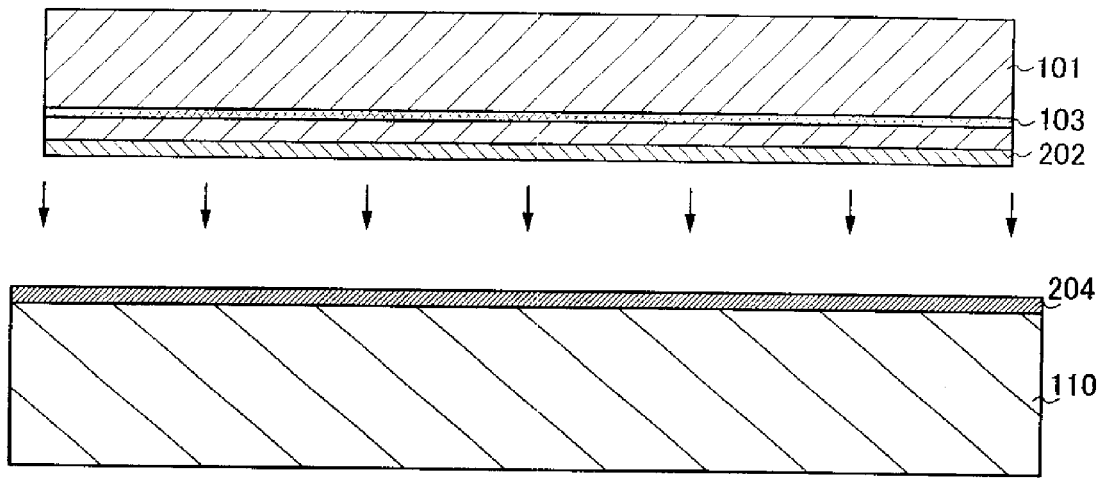

Next, a base substrate provided with a nitrogen-containing layer 204 formed on a surface thereof is prepared, and the semiconductor substrate 101 and the base substrate 110 are bonded to each other (see FIG. 3C). A surface of the insulating layer 202 serving as a bonding layer, which is formed over the semiconductor substrate 101 and a surface of the nitrogen-containing layer 204 formed over the base substrate 110 are disposed in close contact with each other in order to form a bond. This bond is formed by van der Waals forces. The strong bond resulting from hydrogen bonding of Si—H or Si—OH can be formed by pressing the base substrate 110 and the semiconductor substrate 101 against each other.

Note that it is preferable that megasonic cleaning, or megasonic cleaning and ozone water cleaning be performed before the semiconductor substrate 101 and the base substrate 110 are bonded to each other since dust on the surfaces of the substrates can be removed and the surfaces of the substrates can be hydrophilic. Further, plasma treatment is performed on the surface of the nitrogen-containing layer 204, whereby dust such as organic substances on the surface of the substrate may be removed.

As described in the above Embodiment Mode 1, a substrate which shrinks isotropically by heat treatment without depending on certain directions is used as the base substrate 110. The description of the base substrate 110 is omitted here, since Embodiment Mode 1 can be referred to.

The nitrogen-containing layer 204 is bonded to the insulating layer 202 formed over the semiconductor substrate 101. The nitrogen-containing layer 204 serves as a barrier layer which prevents impurities such as mobile ions or moisture, which are included in the base substrate 110, from being diffused into the single-crystal semiconductor layer when the single-crystal semiconductor layer is provided over the base substrate 110 in a later step.

The nitrogen-containing layer 204 is formed to have a single layer structure or a stacked layer structure which includes any of a silicon nitride layer, a silicon nitride oxide layer, or a silicon oxynitride layer by a CVD method or a sputtering method. The nitrogen-containing layer 204 is formed in the range of greater than or equal to 10 nm and less than or equal to 200 nm; preferably the nitrogen-containing layer 204 is formed in the range of greater than or equal to 50 nm and less than or equal to 100 nm. In addition, an insulating layer having a smooth surface is preferably used as the nitrogen-containing layer 204. It is preferable that the nitrogen-containing layer 204 be formed such that a mean surface roughness (Ra) is 0.5 nm or less and a root-mean-square roughness (Rms) is 0.6 nm or less; more preferably, Ra is 0.3 nm or less and Rms is 0.4 nm or less.

For example, a silicon nitride oxide layer which is formed by a plasma CVD method at a low temperature (ranging from 100° C. or higher to 350° C. or lower; preferably ranging from 150° C. or higher to 300° C. or lower) is suitable as the nitrogen-containing layer 204. A silicon nitride oxide layer having a smooth surface can be obtained by forming the silicon nitride oxide layer by a plasma CVD method at a low temperature. Further, the amount of H (hydrogen) included in the nitrogen-containing layer 204 can be increased by forming the nitrogen-containing layer 204 at a low temperature, thereby strengthening bonding to the base substrate.

In this embodiment mode, the base substrate 110 preferably has a smooth surface since the nitrogen-containing layer 204 is formed over the base substrate 110 which is a glass substrate or the like. For example, as the base substrate 110, a glass substrate of which a surface is set as follows is preferably used: a mean surface roughness (Ra) is 0.5 nm or less and a root-mean-square roughness (Rms) is 0.6 nm or less; more preferably, Ra is 0.3 nm or less and Rms is 0.4 nm or less. Thus, for example, the nitrogen-containing layer 204 may be formed over a glass substrate on a surface of which polishing treatment is performed in advance.

After the base substrate 110 is bonded to the semiconductor substrate 101 with the insulating layer 202 and the nitrogen-containing layer 204 interposed therebetween (see FIG. 4A), it is preferable that one or both of heat treatment and pressure treatment be performed. By performing heat treatment or pressure treatment, bonding strength between the base substrate 110 and the semiconductor substrate 101 can be improved. The heat treatment is performed at a temperature lower than or equal to the upper temperature limit of the base substrate 110. For example, the heat treatment may be performed at 200° C. in this embodiment mode. The pressure treatment is performed such that pressure is applied to the bonding surface in a perpendicular direction in consideration of the pressure resistance of the base substrate 110 and the semiconductor substrate 101.

Figure 4A:
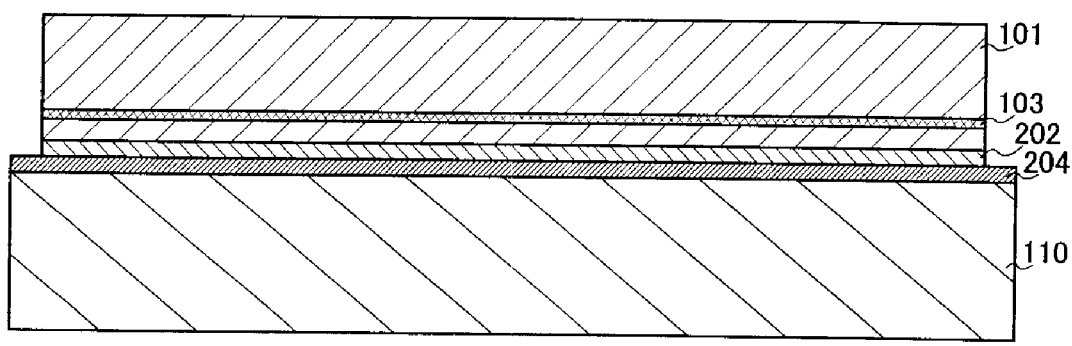
FIGS. 4A and 4B illustrate an example of a method for manufacturing an SOI substrate of the present invention.
Figure 4B:
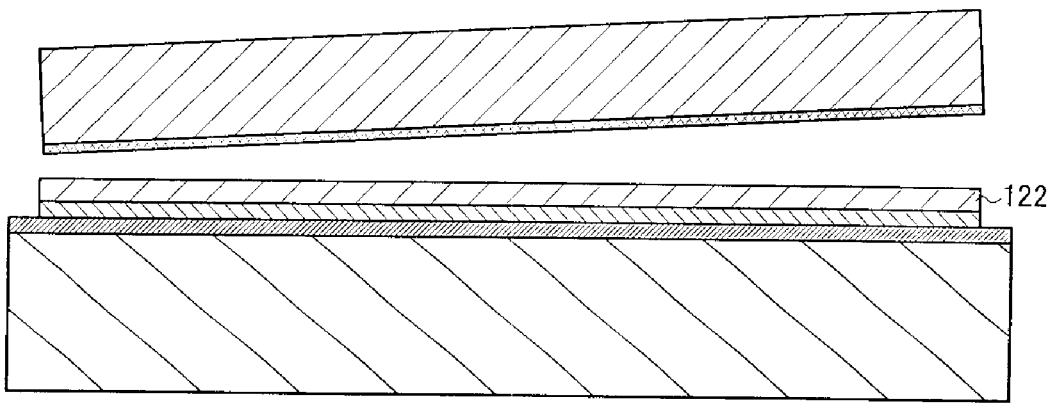

And then, heat treatment is performed to separate a part of the semiconductor substrate 101 from the base substrate 110 with the separation layer 103 used as a cleavage plane (see FIG. 4B). The heat treatment temperature is preferably higher than or equal to the film formation temperature of the insulating layer 202 and is also preferably lower than or equal to the upper temperature limit of the base substrate 110. For example, the heat treatment is performed at a temperature ranging from 400° C. to 700° C., whereby the volume of the microvoids formed in the separation layer 103 is changed, and thus cleavage is performed along the separation layer 103. Since the insulating layer 202 is bonded to the base substrate 110 with the nitrogen-containing layer 204 interposed therebetween, the single-crystal semiconductor layer 122 having the same crystallinity as the semiconductor substrate 101 is left over the base substrate 110.

Through the above steps, an SOI substrate where the single-crystal semiconductor layer 122 is provided over the base substrate 110 with the insulating layer 202 and the nitrogen-containing layer 204 interposed therebetween can be obtained.

Although in this embodiment mode, heat treatment is preformed in FIGS. 4A and 4B, as described above, the base substrate 110 can be prevented from shrinking in certain directions by using a substrate which shrinks isotropically by heat treatment as the base substrate 110. As a result, distortion which is caused in the single-crystal semiconductor layer 122 provided over the base substrate 110 in a certain direction after separation can be reduced.

A method for manufacturing an SOI substrate described in this embodiment mode can be combined with manufacturing methods described in other embodiment modes in this specification, as appropriate.

(Embodiment Mode 3)

This embodiment mode describes a method for manufacturing a semiconductor device using the SOI substrate which is manufactured according to the above embodiment modes.

First, a method for manufacturing an n-channel transistor and a p-channel transistor is described as a method for manufacturing a semiconductor device with reference to FIGS. 5A to 5D and FIGS. 6A to 6C. By combining a plurality of thin film transistors (TFTs), various semiconductor devices can be formed.

Figure 5A:
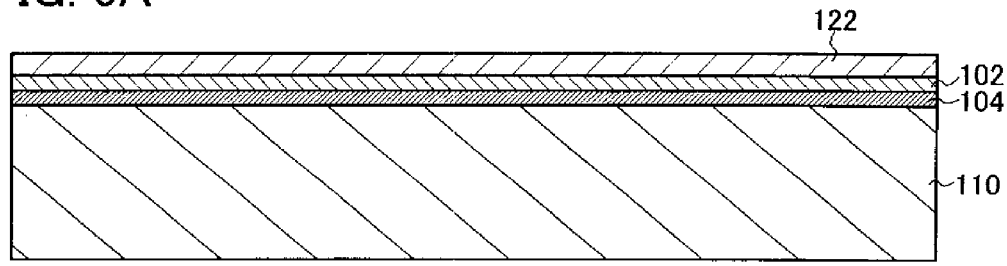
FIGS. 5A to 5D illustrate an example of a method for manufacturing a semiconductor device using an SOI substrate of the present invention.

In this embodiment mode, the SOI substrate which is manufactured according to the method of Embodiment Mode 1 is used as an SOI substrate. FIG. 5A is a cross-sectional view of the SOI substrate which is manufactured according to the method described with reference to FIGS. 1A to 1D.

Figure 5B:
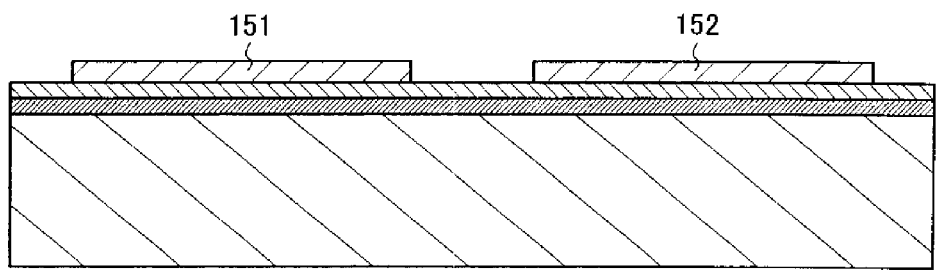

The single-crystal semiconductor layer 122 of the SOI substrate is isolated for each element by etching, whereby a semiconductor layer 151 and a semiconductor layer 152 are formed as illustrated in FIG. 5B. The semiconductor layer 151 is used for forming an n-channel TFT, and the semiconductor layer 152 is used for forming a p-channel TFT.

Figure 5C:
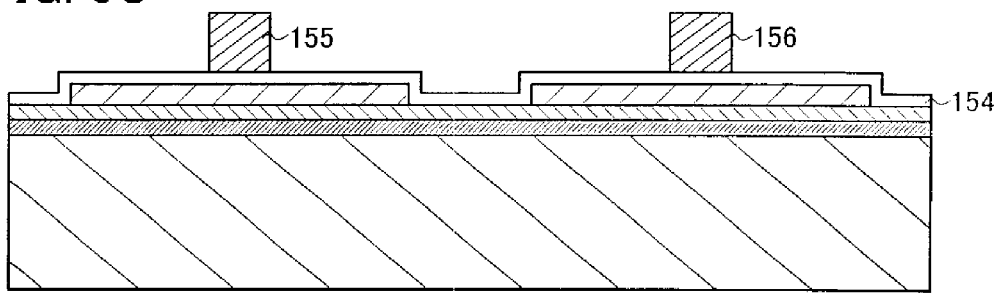

As illustrated in FIG. 5C, an insulating layer 154 is formed over the semiconductor layer 151 and the semiconductor layer 152. And then, a gate electrode 155 is formed over the semiconductor layer 151 with the insulating layer 154 interposed therebetween, and a gate electrode 156 is formed over the semiconductor layer 152 with the insulating layer 154 interposed therebetween.

Before the single-crystal semiconductor layer 122 is etched, it is preferable to add an impurity element which serves as an acceptor, such as boron, aluminum, or gallium, or an impurity element which serves as a donor, such as phosphorus or arsenic, to the single-crystal semiconductor layer 122 in order to control the threshold voltage of the TFTs. For example, an acceptor is added to a region where the n-channel TFT is formed, and a donor is added to a region where the p-channel TFT is formed.

Figure 5D:
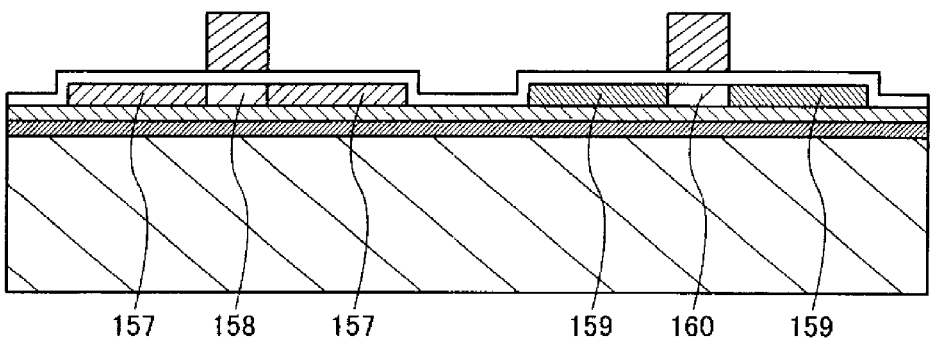

And then, as illustrated in FIG. 5D, n-type low-concentration impurity regions 157 are formed in the semiconductor layer 151, and p-type high-concentration impurity regions 159 are formed in the semiconductor layer 152. First, the n-type low-concentration impurity regions 157 are formed in the semiconductor layer 151. In order to form the n-type low-concentration impurity regions 157, the semiconductor layer 152 where the p-channel TFT is formed is covered with a resist mask, and a donor is added to the semiconductor layer 151. As the donor, phosphorus or arsenic may be added. When the donor is added by an ion doping method or an ion implantation method, the n-type low-concentration impurity regions 157 are formed in the semiconductor layer 151 in a self-aligned manner since the gate electrode 155 serves as a mask. A region of the semiconductor layer 151 which overlaps with the gate electrode 155 serves as a channel formation region 158.

And then, after the mask which covers the semiconductor layer 152 is removed, the semiconductor layer 151 where the n-channel TFT is formed is covered with a resist mask. Next, the acceptor is added to the semiconductor layer 152 by an ion doping method or an ion implantation method. Boron can be added as the acceptor. At the step of adding the acceptor, the gate electrode 155 serves as a mask and the p-type high-concentration impurity regions 159 are formed in the semiconductor layer 152 in a self-aligned manner. The high-concentration impurity regions 159 serve as a source region and a drain region. A region of the semiconductor layer 152 which overlaps with the gate electrode 156 serves as a channel formation region 160. Here, the method in which the p-type high-concentration impurity regions 159 are formed after the n-type low-concentration impurity regions 157 are formed is described; however, the p-type high-concentration impurity regions 159 can be formed first.

Figure 6A:
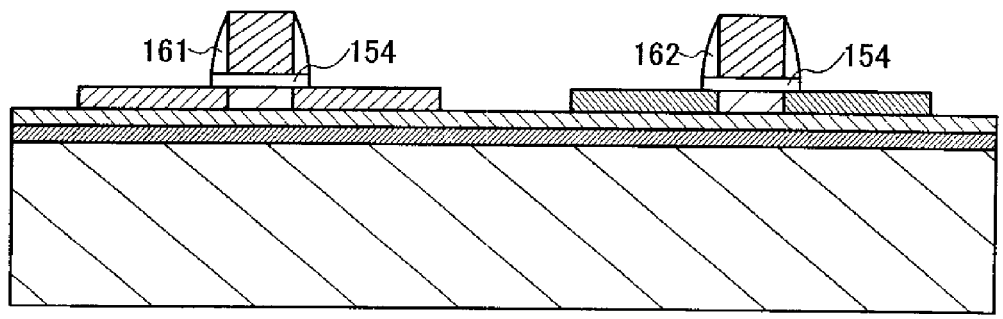
FIGS. 6A to 6C illustrate an example of a method for manufacturing a semiconductor device using an SOI substrate of the present invention.

And then, after the resist which covers the semiconductor layer 151 is removed, an insulating film having a single layer structure or a stacked layer structure, which includes a nitrogen compound such as silicon nitride or an oxide such as silicon oxide, is formed by a plasma CVD method or the like. This insulating layer is anisotropically etched in a perpendicular direction, whereby sidewall insulating layers 161 and 162 which are in contact with side surfaces of the gate electrodes 155 and 156, respectively, are formed as illustrated in FIG. 6A. By this anisotropic etching, the insulating layer 154 is also etched.

Figure 6B:
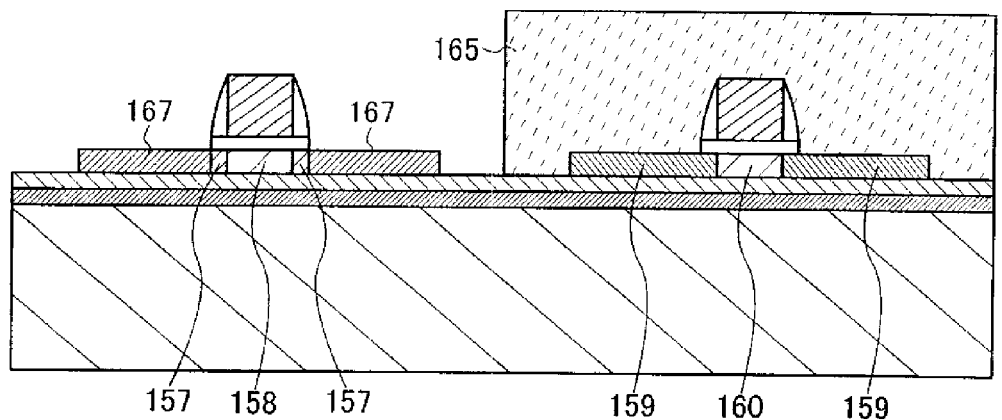

Next, as illustrated in FIG. 6B, the semiconductor layer 152 is covered with a resist 165. In order to form high-concentration impurity regions serving as a source region and a drain region in the semiconductor layer 151, a high dosage of donors is added to the semiconductor layer 151 by an ion implantation method or an ion doping method. The gate electrode 155 and the sidewall insulating layer 161 serve as masks, and n-type high-concentration impurity regions 167 are formed. And then, heat treatment for activating the donors and the acceptors is performed.

Figure 6C:
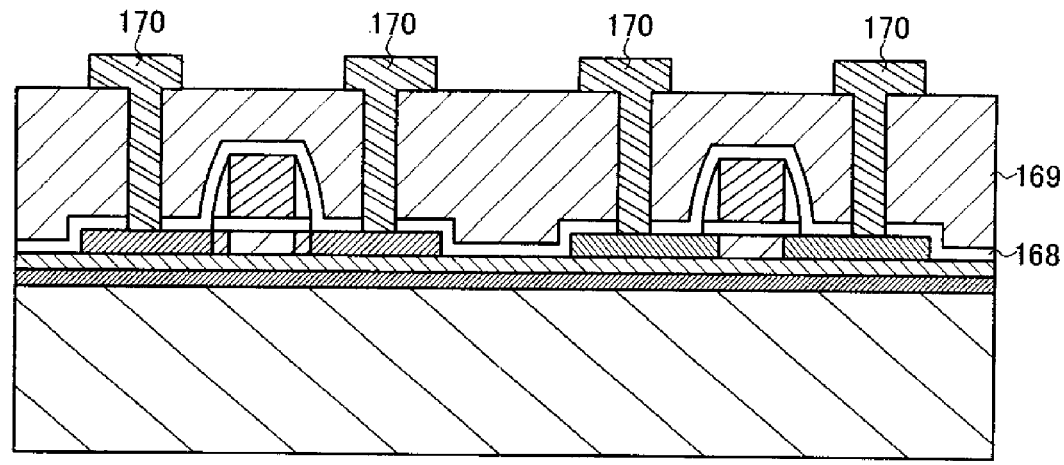

After the heat treatment for activation, an insulating layer 168 containing hydrogen is formed as illustrated in FIG. 6C. After the insulating layer 168 is formed, heat treatment is performed at a temperature ranging from 350° C. or higher to 450° C. or lower, whereby hydrogen contained in the insulating layer 168 is diffused into the semiconductor layers 151 and 152. The insulating layer 168 can be formed by depositing silicon nitride or silicon nitride oxide by a plasma CVD method at a process temperature of 350° C. or lower. By supplying hydrogen to the semiconductor layers 151 and 152, defects which are to be trapping centers in the semiconductor layers 151 and 152 or at an interface with the insulating layer 154 can be efficiently compensated.

After that, an interlayer insulating layer 169 is formed. The interlayer insulating layer 169 can be formed of a film with a single layer structure or a stacked layer structure which is formed of any one or more of films selected from an insulating film containing an inorganic material such as a silicon oxide film or a BPSG (borophosphosilicate glass) film, or an organic resin film containing polyimide, acrylic, or the like. After contact holes are formed in the interlayer insulating layer 169, wirings 170 are formed as illustrated in FIG. 6C. The wirings 170 can be formed of a conductive film with a three-layer structure in which a low-resistance metal film such as an aluminum film or an aluminum-alloy film is sandwiched between barrier metal films. The barrier metal films can be formed of metal films containing molybdenum, chromium, titanium, or the like.

Through the above steps, a semiconductor device having the n-channel TFT and the p-channel TFT can be manufactured. Since the metal element concentration of the semiconductor layer in which the channel formation region is formed is reduced in the manufacturing process of the SOI substrate, a TFT in which off current is small and variation of the threshold voltage is suppressed can be manufactured.

Although the method for manufacturing the TFT is described with reference to FIGS. 5A to 5D and FIGS. 6A to 6C, a semiconductor device with higher added value can be manufactured by forming various semiconductor elements such as a capacitor and a resistor together with the TFT. Hereinafter, a specific mode of the semiconductor device is described with reference to the drawings.

Figure 7:
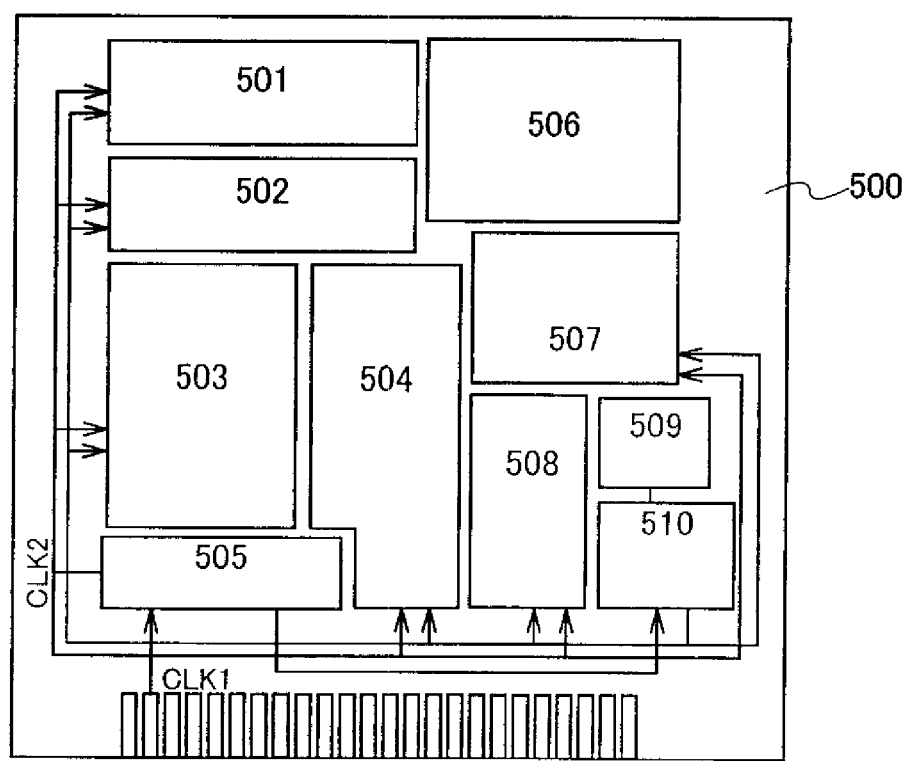
FIG. 7 illustrates an example of a semiconductor device using an SOI substrate of the present invention.

First, a microprocessor is described as an example of a semiconductor device. FIG. 7 is a block diagram illustrating a structural example of a microprocessor 500.

The microprocessor 500 has an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read only memory 509, and a memory interface 510.

An instruction input to the microprocessor 500 via the bus interface 508 is input to the instruction decoder 503 and decoded. Then, the instruction is input to the ALU controller 502, the interrupt controller 504, the register controller 507, and the timing controller 505. The ALU controller 502, the interrupt controller 504, the register controller 507, and the timing controller 505 perform various controls based on the decoded instruction.

The ALU controller 502 generates a signal for controlling the operation of the arithmetic logic unit 501. While the microprocessor 500 is executing a program, the interrupt controller 504 judges an interrupt request from an external input and output device or a peripheral circuit based on its priority or a mask state, and processes the interrupt request. The register controller 507 generates an address of the register 506, and reads and writes data from and to the register 506 in accordance with the state of the microprocessor 500. The timing controller 505 generates signals for controlling timing of driving of the arithmetic logic unit 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1. As illustrated in FIG. 7, the internal clock signal CLK2 is input to another circuit.

Figure 8:
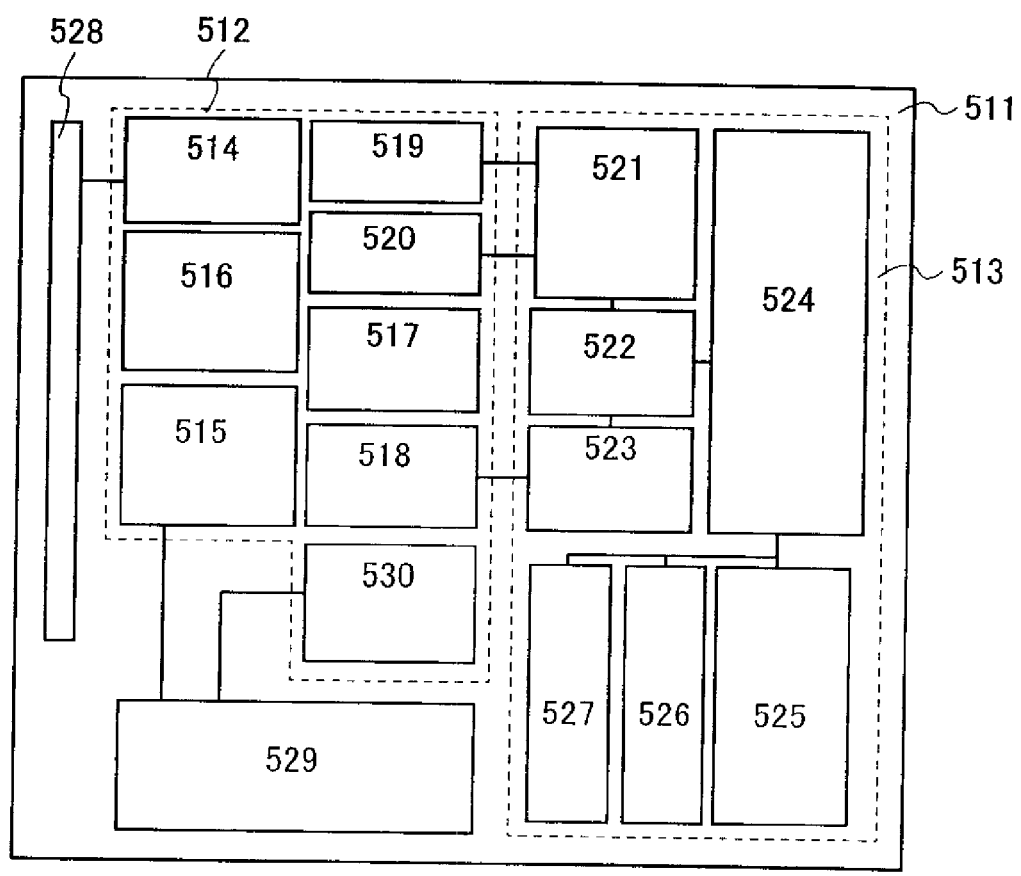
FIG. 8 illustrates an example of a semiconductor device using an SOI substrate of the present invention.

Next, an example of a semiconductor device having a function of communicating data wirelessly and also having an arithmetic function is described. FIG. 8 is a block diagram illustrating a structural example of such a semiconductor device. The semiconductor device illustrated in FIG. 8 can be referred to as a computer (hereinafter referred to as an "RFCPU") which operates to transmit and receive signals to and from an external device by wireless communication.

As illustrated in FIG. 8, an RFCPU 511 has an analog circuit portion 512 and a digital circuit portion 513. The analog circuit portion 512 includes a resonance circuit 514 having a resonant capacitor, a rectifier circuit 515, a constant voltage circuit 516, a reset circuit 517, an oscillator circuit 518, a demodulation circuit 519, a modulation circuit 520, and a power supply management circuit 530. The digital circuit portion 513 includes an RF interface 521, a control register 522, a clock controller 523, a CPU interface 524, a central processing unit 525, a random access memory 526, and a read only memory 527.

The operation of the RFCPU 511 is roughly described below. Induced electromotive force is generated by the resonance circuit 514 based on a signal received at an antenna 528. The induced electromotive force is stored in a capacitor portion 529 via the rectifier circuit 515. The capacitor portion 529 is preferably formed using a capacitor such as a ceramic capacitor or an electric double layer capacitor. The capacitor portion 529 is not necessarily integrated over the same substrate as the RFCPU 511 and may be incorporated into the RFCPU 511 as a component.

The reset circuit 517 generates a signal which resets the digital circuit portion 513 to be initialized. For example, a signal which rises after an increase in a power supply voltage is generated as the reset signal. The oscillator circuit 518 changes the frequency and the duty ratio of a clock signal in accordance with a control signal generated by the constant voltage circuit 516. The demodulation circuit 519 demodulates a received signal, and the modulation circuit 520 modulates data to be transmitted.

For example, the demodulation circuit 519 is formed using a low-pass filter and binarizes a received signal of an amplitude shift keying (ASK) system based on variation of the amplitude. The modulation circuit 520 transmits transmission data by changing the amplitude of a transmission signal of the amplitude shift keying (ASK) system. The modulation circuit 520 changes the resonance point of the resonance circuit 514, whereby the amplitude of a communication signal is changed.

The clock controller 523 generates a control signal for changing the frequency and the duty ratio of the clock signal in accordance with the power supply voltage or current consumption in the central processing unit 525. The power supply voltage is monitored by the power supply control circuit 530.

A signal which is input into the RFCPU 511 from the antenna 528 is demodulated by the demodulation circuit 519, and then divided into a control command, data, and the like by the RF interface 521. The control command is stored in the control register 522. The control command includes reading of data stored in the read only memory 527, writing of data to the random access memory 526, an arithmetic instruction to the central processing unit 525, and the like.

The central processing unit 525 accesses the read only memory 527, the random access memory 526, and the control register 522 via the CPU interface 524. The CPU interface 524 has a function of generating an access signal for any one of the read only memory 527, the random access memory 526, and the control register 522 based on an address requested by the central processing unit 525.

As an arithmetic method of the central processing unit 525, a method can be employed in which the read only memory 527 stores an operating system (OS) and a program is read at the time of starting operation and then is executed. Alternatively, a method can be employed in which a circuit dedicated to arithmetic is formed as an arithmetic circuit and an arithmetic processing is conducted using hardware. In a method in which both hardware and software are used, part of arithmetic processing can be conducted by a circuit dedicated to arithmetic, and the other part of the arithmetic processing can be conducted by the central processing unit 525 using a program.

Next, a display device is described as a semiconductor device with reference to FIG. 9, FIGS. 10A and 10B, and FIGS. 11A and 11B.

In the method for manufacturing the SOI substrate described in the above Embodiment Modes 1 and 2, a glass substrate can be employed as the base substrate 110. Therefore, by using a glass substrate as the base substrate 110 and bonding a plurality of semiconductor layers thereto, a large-sized SOI substrate with each side over one meter in length can be manufactured.

Figure 9:
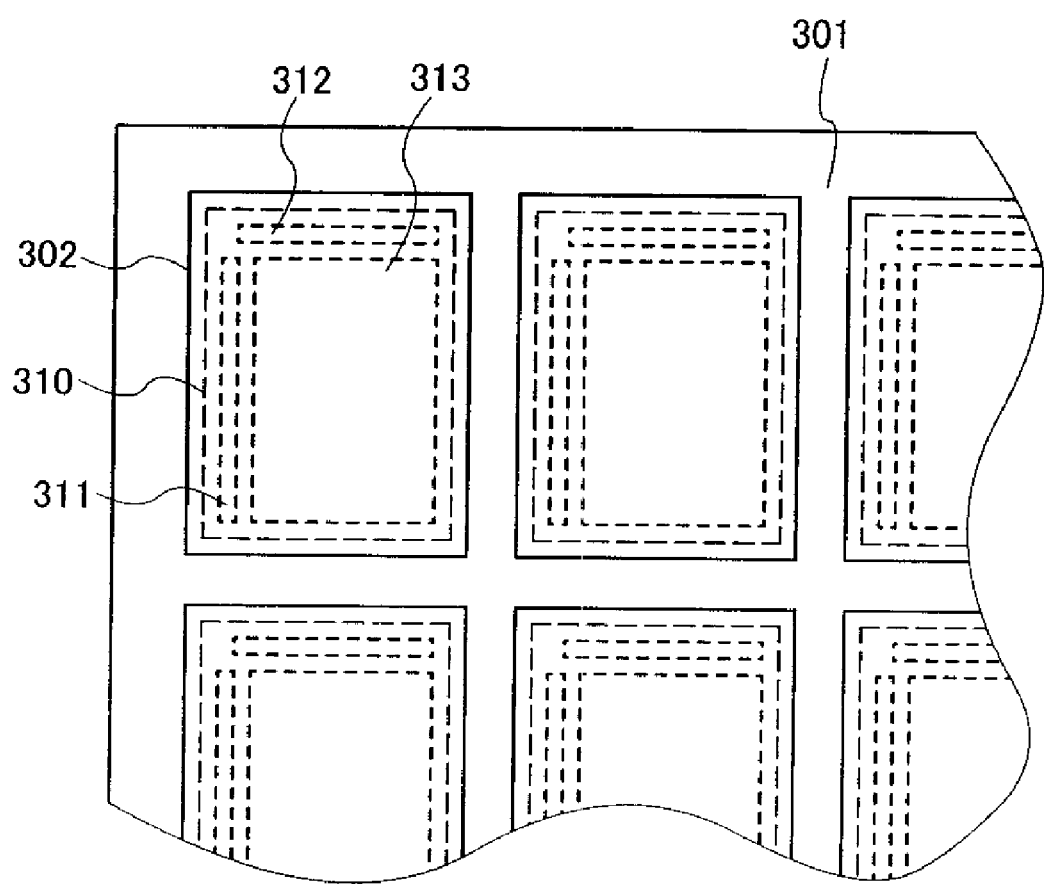
FIG. 9 illustrates an example of a display device using an SOI substrate of the present invention.

A large-sized glass substrate called mother glass over which a display panel is manufactured can be used as a base substrate of an SOI substrate. FIG. 9 is a front view of an SOI substrate in which a mother glass is used as the base substrate 110. By forming a plurality of semiconductor elements over such a large-sized SOI substrate, a liquid crystal display device or an electroluminescent display device can be manufactured. In addition to such display devices, various kinds of semiconductor devices such as a solar battery, a photo IC, and a semiconductor memory device can be manufactured using an SOI substrate.

As illustrated in FIG. 9, single-crystal semiconductor layers 302 which are separated from a plurality of semiconductor substrates are bonded to a mother glass 301. In order to cut out a plurality of display panels from the mother glass 301, formation regions 310 of the display panels are preferably included in the single-crystal semiconductor layers 302. Each of the display panels includes a scanning line driver circuit, a signal line driver circuit, and a pixel portion. Therefore, the formation regions 310 of the display panels include regions where a scanning line driver circuit formation region 311, a signal line driver circuit formation region 312, and a pixel formation region 313 are formed.

Figure 10A:
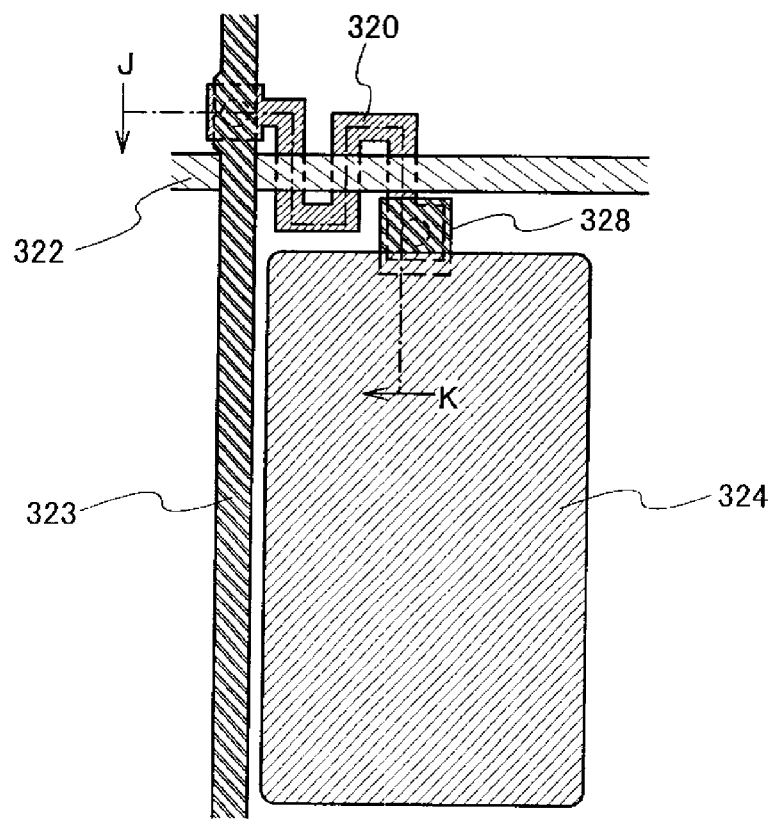
FIGS. 10A and 10B illustrate an example of a display device using an SOI substrate of the present invention.
Figure 10B:
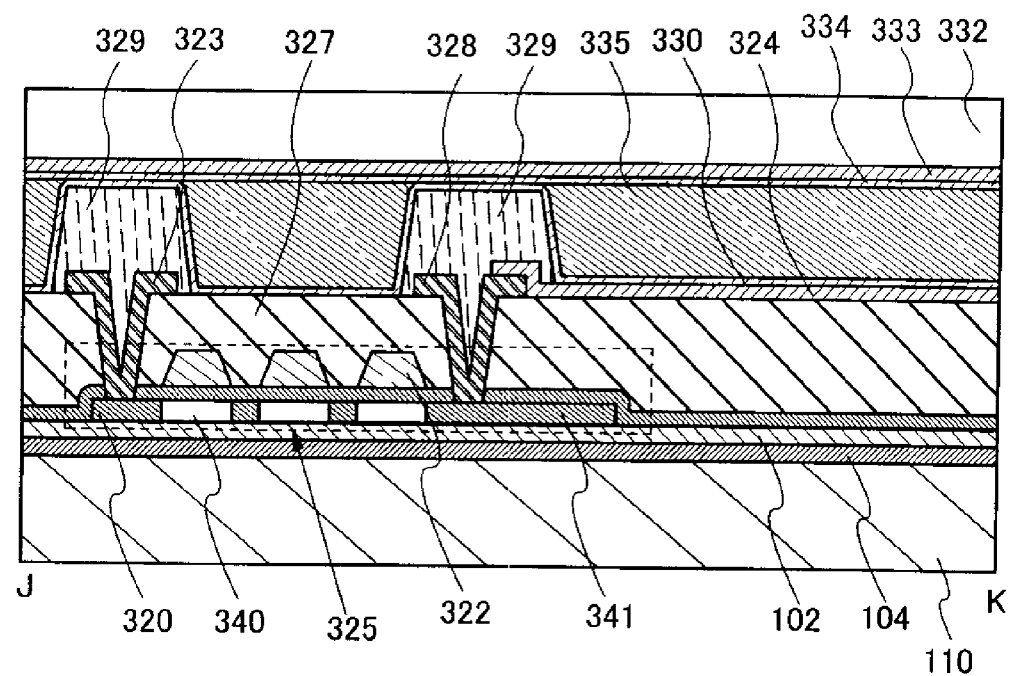

FIGS. 10A and 10B are drawings for describing a liquid crystal display device. FIG. 10A is a plan view of a pixel of a liquid crystal display device, and FIG. 10B is a cross-sectional view taken along a line J-K in FIG. 10A.

As illustrated in FIG. 10A, a pixel includes a single-crystal semiconductor layer 320, a scanning line 322 intersecting with the single-crystal semiconductor layer 320, a signal line 323 intersecting with the scanning line 322, a pixel electrode 324, and an electrode 328 which electrically connects the pixel electrode 324 to the single-crystal semiconductor layer 320. The single-crystal semiconductor layer 320 is a layer formed of the single-crystal semiconductor layer 302 bonded to the SOI substrate and is included in a TFT 325 of the pixel.

As an SOI substrate, the SOI substrate manufactured according to the method of Embodiment Mode 1 is used. As illustrated in FIG. 10B, the nitrogen-containing layer 104, the insulating layer 102, and the single-crystal semiconductor layer 320 are stacked over the base substrate 110. The base substrate 110 is the mother glass 301 which is divided. A semiconductor layer of the SOI substrate is isolated for each element by etching, whereby the single-crystal semiconductor layer 320 of the TFT 325 is formed. A channel formation region 340 and n-type high-concentration impurity regions 341 to which donors are added are formed in the single-crystal semiconductor layer 320. A gate electrode of the TFT 325 is included in the scanning line 322 and one of a source electrode and a drain electrode of the TFT 325 is included in the signal line 323.

The signal line 323, the pixel electrode 324, and the electrode 328 are provided over an interlayer insulating film 327. Further, column spacers 329 are formed over the interlayer insulating film 327, and an orientation film 330 is formed to cover the signal line 323, the pixel electrode 324, the electrode 328, and the column spacers 329. A counter substrate 332 is provided with a counter electrode 333 and an orientation film 334 which covers the counter electrode 333. The column spacers 329 are formed to fill spaces between the base substrate 110 and the counter substrate 332. A liquid crystal layer 335 is formed in a space which is formed by the column spacers 329. The interlayer insulating film 327 has a step at the connection portion between the n-type high-concentration impurity regions 341, and the signal line 323 and the electrode 328 due to formation of contact holes; therefore, orientation of liquid crystals in the liquid crystal layer 335 is easily disordered at this connection portion. Therefore, the column spacers 329 are formed at the step portions to prevent the disorder of the orientation of liquid crystals.

Figure 11A:
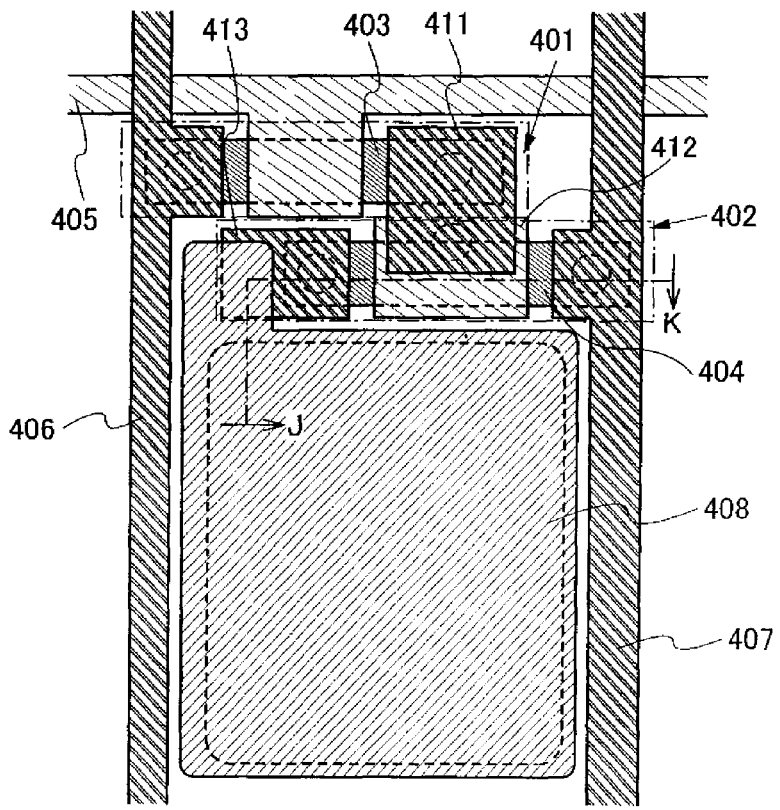
FIGS. 11A and 11B illustrate an example of a display device using an SOI substrate of the present invention.
Figure 11B:
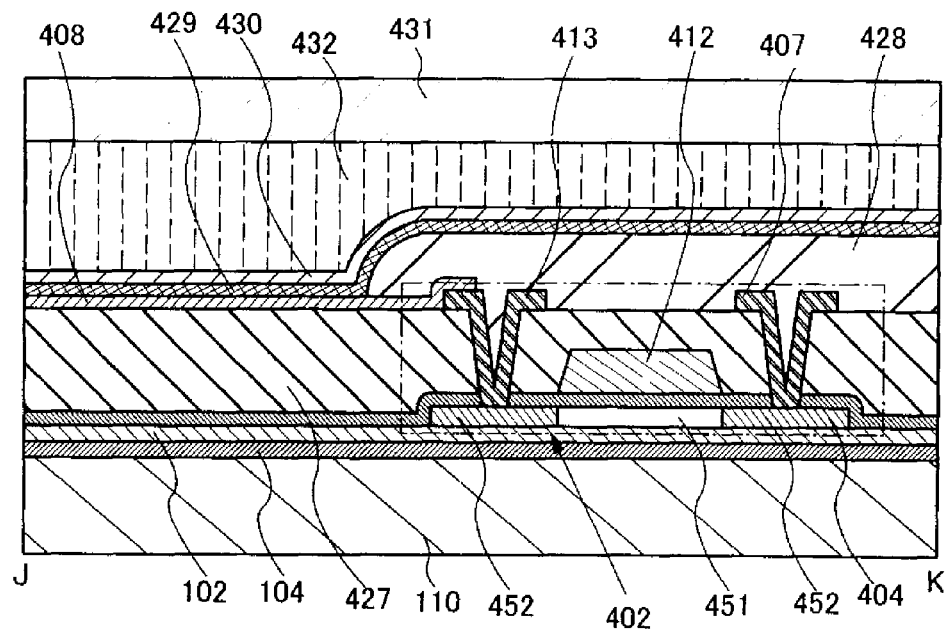

Next, an electroluminescent display device (hereinafter referred to as an EL display device) is described with reference to FIGS. 11A and 11B. FIG. 11A is a plan view of a pixel of an EL display device, and FIG. 11B is a cross-sectional view taken along a line J-K in FIG. 11A.

As illustrated in FIG. 11A, a pixel includes a TFT as a selection transistor 401; a TFT as a display control transistor 402; a scanning line 405; a signal line 406; a current supply line 407; and a pixel electrode 408. Each pixel is provided with a light-emitting element having a structure in which a layer including an electroluminescent material (an EL layer) is sandwiched between a pair of electrodes. One electrode of the light emitting element is the pixel electrode 408. Further, in a semiconductor layer 403, a channel formation region, a source region, and a drain region of the selection transistor 401 are formed. Further, in a semiconductor layer 404, a channel formation region, a source region, and a drain region of the display control transistor 402 are formed. The semiconductor layers 403 and 404 are layers formed of the single-crystal semiconductor layer 302 bonded to the SOI substrate.

In the selection transistor 401, a gate electrode is included in the scanning line 405, one of a source electrode and a drain electrode is included in the signal line 406, and the other thereof is formed as an electrode 411. In the display control transistor 402, a gate electrode 412 is electrically connected to an electrode 411, one of a source electrode and a drain electrode is formed as an electrode 413 which is electrically connected to the pixel electrode 408, and the other thereof is included in the current supply line 407.

The display control transistor 402 is a p-channel TFT. As illustrated in FIG. 11B, a channel formation region 451 and p-type high-concentration impurity regions 452 are formed in the semiconductor layer 404. As an SOI substrate, an SOI substrate manufactured by the method according to Embodiment Mode 1 is used.

An interlayer insulating film 427 is formed so as to cover the gate electrode 412 of the display control transistor 402. Over the interlayer insulating film 427, the signal line 406, the current supply line 407, the electrode 411, the electrode 413, and the like are formed. Over the interlayer insulating film 427, the pixel electrode 408 which is electrically connected to the electrode 413 is formed. The pixel electrode 408 is surrounded by a partition wall layer 428 which has an insulating property at the periphery. An EL layer 429 is formed over the pixel electrode 408, and a counter electrode 430 is formed over the EL layer 429. A counter substrate 431 is provided as a reinforcing plate and is fixed to the base substrate 110 by a resin layer 432.

The grayscale of the EL display device is controlled by either a current driving method by which the luminance of the light-emitting element is controlled by the amount of current or a voltage driving method by which control is performed basically by the amount of voltage. The current driving method is difficult to be employed when transistors have characteristic values which are largely different in each pixel, and therefore a compensation circuit for compensating variation in characteristics is necessary. The EL display device is manufactured by a manufacturing process of an SOI substrate and a manufacturing method including a gettering step so that the selection transistor 401 and the display control transistor 402 do not have variation in characteristics in each pixel. Thus, the current driving method can be employed.

Namely, various electric appliances can be manufactured by using SOI substrates. The electric appliances include video cameras, digital cameras, navigation systems, audio reproducing devices (such as car audios or audio components), computers, game machines, portable information terminals (such as mobile computers, cellular phones, portable game machines, or electronic books), and image reproducing devices having storage media (specifically, devices with display devices capable of playing audio data stored in storage media and displaying stored image data such as digital versatile disk (DVD)).

Figure 12A:
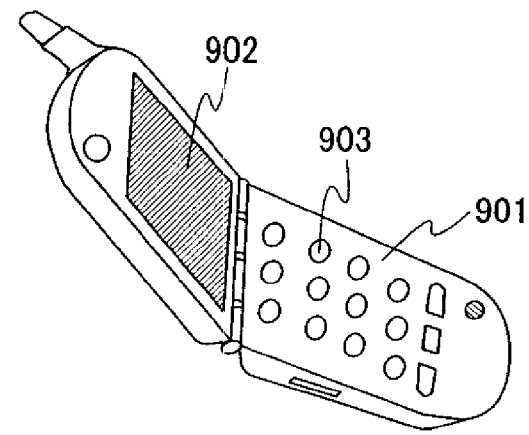
FIGS. 12A to 12C illustrate electronic devices using an SOI substrate of the present invention.

Specific modes of the electronic appliances are described with reference to FIGS. 12A to 12C. FIG. 12A is an external view illustrating an example of a cellular phone 901. This cellular phone 901 includes a display portion 902, an operation switch 903, and the like. By employing the liquid crystal display device illustrated in FIGS. 10A and 10B or the EL display device illustrated in FIGS. 11A and 11B as the display portion 902, the display portion 902 can have little display unevenness and excellent image quality.

Figure 12B:
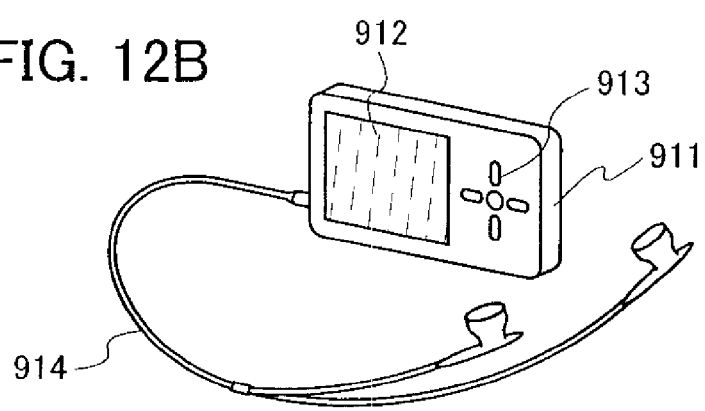

FIG. 12B is an external view illustrating a structural example of a digital player 911. The digital player 911 includes a display portion 912, an operation portion 913, an earphone 914, and the like. The earphone 914 can be replaced by a headphone or a wireless earphone. By employing the liquid crystal display device illustrated in FIGS. 10A and 10B or the EL display device illustrated in FIGS. 11A and 11B as the display portion 912, the display portion 912 can display high-definition images and a large amount of textual information even where the screen size ranges from approximately 0.3 inches to 2 inches.

Figure 12C:
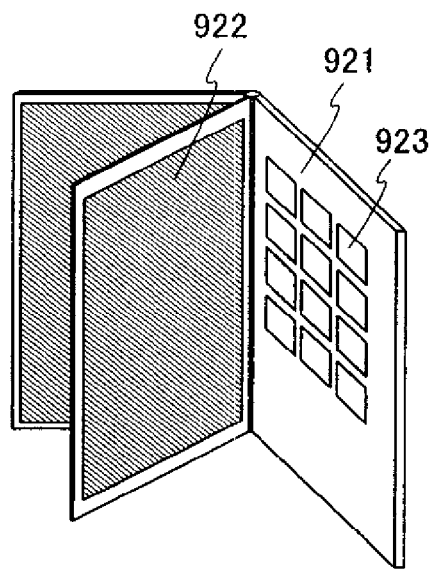

Further, FIG. 12C is an external view of an electronic book 921. This electronic book 921 includes a display portion 922 and an operation switch 923. The electronic book 921 may incorporate a modem or may incorporate the RFCPU illustrated in FIG. 8 so that information can be transmitted and received wirelessly. By employing the liquid crystal display device illustrated in FIGS. 10A and 10B or the EL display device illustrated in FIGS. 11A and 11B as the display portion 922, the display portion 922 can display high-quality images.

[Embodiment 1]

This embodiment describes a shrinkage ratio of a glass substrate on which heat treatment is performed.

First, a glass substrate was prepared, and a plurality of markers was formed at predetermined intervals therebetween over the glass substrate. And then, after heat treatment was performed on the glass substrate, amount of shrink of the glass substrate in the X-axis direction and in the Y-axis direction (shrinkage amount) was measured to obtain a shrinkage ratio.

As a glass substrate, a glass substrate manufactured by ASAHI GLASS CO., LTD. (product name: AN 100) was used. In addition, as a glass substrate, a square glass substrate with each side of 5 inches in length was used. As for the glass substrate, a direction parallel to two certain sides was defined as the X-axis direction, and a direction parallel to other two sides was defined as the Y-axis direction.

As for markers, after a silicon oxynitride film with a thickness of 100 nm and an amorphous silicon film with a thickness of 50 nm were stacked in that order over the glass substrate, the amorphous silicon film was selectively removed to be patterned. And then, the patterned amorphous silicon films were provided at four corners of the glass substrate.

The shrinkage ratio in the X-axis direction was obtained by measuring the shrinkage amount of the glass substrate in the X-axis direction in the heat treatment based on the markers and then dividing the shrinkage amount by a distance between the markers in the X-axis direction before the heat treatment. In this embodiment, the following calculation formula was used to obtain the shrinkage ratio: the shrinkage ratio (ppm)= (the shrinkage amount ($\mu$m)/the distance between the markers (mm))×1000. Note that the average of the shrinkage ratios obtained by using both edges of the glass substrate (a right edge and a left edge) in the X-axis direction was defined as the shrinkage ratio in the X-axis direction. The shrinkage ratio in the Y-axis direction was similarly obtained.

The heat treatment was performed for four hours at a temperature of 600° C., and then the glass substrate was cooled down.

In this embodiment, the same kinds of four glass substrates were prepared, and experiments were conducted on the four glass substrates (substrate A to substrate D) under the same conditions. Table 1 shows a measurement result of shrinkage ratios of the substrate A to the substrate D.

TABLE 1

|  | Shrinkage ratio in X-axis direction (ppm) | Shrinkage ratio in Y-axis direction (ppm) | Average of shrinkage ratios in X-axis direction and in Y-axis direction (ppm) |
|---|---|---|---|
| Substrate A | 168.4 | 177.2 | 172.8 |
| Substrate B | 170.0 | 176.4 | 173.2 |
| Substrate C | 167.8 | 174.0 | 170.9 |
| Substrate D | 166.1 | 175.2 | 170.7 |

It was confirmed that in any of glass substrates, i.e. sample A to sample D, difference between the shrinkage ratio in the X-axis direction and the shrinkage ratio in the Y-axis direction was small, and the shrinkage ratios in the X-axis direction and in the Y-axis direction fell within ±10% of the average value (the average of the shrinkage ratios in the X-axis direction and in the Y-axis direction).

This application is based on Japanese Patent Application serial no. 2007-264983 filed with Japan Patent Office on Oct. 10, 2007, the entire contents of which are hereby incorporated by reference.

What is claimed is:

1. A method for manufacturing an SOI substrate, comprising:
   forming a bonding layer on a surface of a semiconductor substrate;
   forming a separation layer in the semiconductor substrate at a predetermined depth from the surface of the semiconductor substrate after the formation of the bonding layer;
   bonding the bonding layer to a base substrate so that the semiconductor substrate and the base substrate face each other; and
   forming a single-crystal semiconductor layer over the base substrate by separating a part of the semiconductor substrate at the separation layer by a heat treatment,
   wherein the base substrate shrinks isotropically by the heat treatment, and
   wherein the base substrate has a distortion point of 700° C. or lower.

2. The method for manufacturing the SOI substrate according to claim 1, wherein a nitrogen-containing layer is used as the bonding layer.

3. The method for manufacturing the SOI substrate according to claim 1, wherein the heat treatment is performed at a temperature ranging from 400° C. or higher to 700° C. or lower.

4. The method for manufacturing the SOI substrate according to claim 1, wherein the base substrate has a thermal expansion coefficient which is the same as or substantially the same as, or larger than a thermal expansion coefficient of the semiconductor substrate.

5. The method for manufacturing the SOI substrate according to claim 1, wherein the thermal expansion coefficient of the base substrate is 0.85 times to twice as high as the thermal expansion coefficient of the semiconductor substrate.

6. The method for manufacturing the SOI substrate according to claim 1, wherein a silicon substrate is used as the semiconductor substrate and a substrate having a thermal expansion coefficient ranging from $2.3 \times 10^{-6}$ to $5.0 \times 10^{-6}$/° C. is used as the base substrate.

7. The method for manufacturing the SOI substrate according to claim 1, wherein a glass substrate is used as the base substrate.

8. The method for manufacturing the SOI substrate according to claim 7, wherein a surface of the glass substrate is polished.

9. The method for manufacturing the SOI substrate according to claim 7, wherein a mean surface roughness of the glass substrate is 0.3 nm or less.

10. A method for manufacturing an SOI substrate, comprising:
    preparing a semiconductor substrate provided with an insulating layer formed on a surface thereof, a bonding layer formed over the insulating layer, and a separation layer formed at a predetermined depth from the surface thereof;
    bonding the bonding layer to a base substrate so that the semiconductor substrate and the base substrate face each other; and
    forming a single-crystal semiconductor layer over the base substrate by separating a part of the semiconductor substrate at the separation layer by a heat treatment,
    wherein a nitrogen-containing layer is used as the bonding layer,
    wherein the base substrate shrinks isotropically by the heat treatment, and
    wherein the base substrate has a distortion point of 700° C. or lower.

11. The method for manufacturing the SOI substrate according to claim 10, wherein a silicon oxide film formed by a chemical vapor deposition method using an organosilane gas is used as the insulating layer.

12. The method for manufacturing the SOI substrate according to claim 10, wherein the heat treatment is performed at a temperature ranging from 400° C. or higher to 700° C. or lower.

13. The method for manufacturing the SOI substrate according to claim 10, wherein the base substrate has a thermal expansion coefficient which is the same as or substantially the same as, or larger than a thermal expansion coefficient of the semiconductor substrate.

14. The method for manufacturing the SOI substrate according to claim 10, wherein the thermal expansion coefficient of the base substrate is 0.85 times to twice as high as the thermal expansion coefficient of the semiconductor substrate.

15. The method for manufacturing the SOI substrate according to claim 10, wherein a silicon substrate is used as the semiconductor substrate and a substrate having a thermal expansion coefficient ranging from $2.3 \times 10^{-6}$ to $5.0 \times 10^{-6}$/° C. is used as the base substrate.

16. The method for manufacturing the SOI substrate according to claim 10, wherein a glass substrate is used as the base substrate.

17. The method for manufacturing the SOI substrate according to claim 16, wherein a surface of the glass substrate is polished.

18. The method for manufacturing the SOI substrate according to claim 16, wherein a mean surface roughness of the glass substrate is 0.3 nm or less.

19. A method for manufacturing an SOI substrate, comprising:
    preparing a semiconductor substrate provided with a bonding layer formed on a surface thereof and a separation layer formed at a predetermined depth from the surface thereof;
    bonding the bonding layer to an insulating layer formed over a base substrate so that the semiconductor substrate and the base substrate face each other; and
    forming a single-crystal semiconductor layer over the base substrate by separating a part of the semiconductor substrate at the separation layer by a heat treatment,
    wherein the base substrate which shrinks isotropically by the heat treatment, and
    wherein the base substrate has a distortion point of 700° C. or lower.

20. The method for manufacturing the SOI substrate according to claim 19, wherein a silicon oxide film formed by a chemical vapor deposition method using an organosilane gas is used as the bonding layer and wherein a nitrogen-containing layer is used as the insulating layer.

21. The method for manufacturing the SOI substrate according to claim 19, wherein a nitrogen-containing layer is used as the bonding layer.

22. The method for manufacturing the SOI substrate according to claim 19, wherein the heat treatment is performed at a temperature ranging from 400° C. or higher to 700° C. or lower.

23. The method for manufacturing the SOI substrate according to claim 19, wherein the base substrate has a thermal expansion coefficient which is the same as or substantially the same as, or larger than a thermal expansion coefficient of the semiconductor substrate.

24. The method for manufacturing the SOI substrate according to claim 19, wherein the thermal expansion coefficient of the base substrate is 0.85 times to twice as high as the thermal expansion coefficient of the semiconductor substrate.

25. The method for manufacturing the SOI substrate according to claim 19, wherein a silicon substrate is used as the semiconductor substrate and a substrate having a thermal expansion coefficient ranging from $2.3 \times 10^{-6}$ to $5.0 \times 10^{-6}$/° C. is used as the base substrate.

26. The method for manufacturing the SOI substrate according to claim 19, wherein a glass substrate is used as the base substrate.

27. The method for manufacturing the SOI substrate according to claim 26, wherein a surface of the glass substrate is polished.

28. The method for manufacturing the SOI substrate according to claim 26, wherein a mean surface roughness of the glass substrate is 0.3 nm or less.

29. A method for manufacturing a semiconductor device, comprising:
- forming a separation layer at a predetermined depth from a surface of a semiconductor substrate by adding ions to the semiconductor substrate;
- forming a bonding layer over the semiconductor substrate;
- bonding the bonding layer to a base substrate so that the semiconductor substrate and the base substrate face each other;
- forming a single-crystal semiconductor layer over the base substrate by separating a part of the semiconductor substrate at the separation layer by a heat treatment;
- forming at least one semiconductor island by patterning the single-crystal semiconductor layer; and
- forming a gate electrode over the semiconductor island with a gate insulating film interposed therebetween,
- wherein the base substrate having a distortion point of 700° C. or lower, and
- wherein the base substrate shrinks isotropically by the heat treatment.

30. The method for manufacturing the semiconductor device according to claim 29, wherein the step of adding ions is performed through an insulating film formed on the semiconductor substrate.

31. The method for manufacturing the semiconductor device according to claim 30, wherein the insulating film includes silicon oxide.

32. The method for manufacturing the semiconductor device according to claim 30, wherein a silicon oxide film formed by a chemical vapor deposition method using an organosilane gas is used as the bonding layer and wherein a nitrogen-containing layer is used as the insulating film.

33. The method for manufacturing the semiconductor device according to claim 29, wherein the ions added to the semiconductor substrate includes hydrogen ion.

34. The method for manufacturing the semiconductor device according to claim 29, wherein the predetermined depth of the separation layer from the surface of the semiconductor substrate is in a range of greater than or equal to 10 nm and less than or equal to 500 nm.

35. The method for manufacturing the semiconductor device according to claim 29, wherein a nitrogen-containing layer is used as the bonding layer.

36. The method for manufacturing the semiconductor device according to claim 29, wherein the heat treatment is performed at a temperature ranging from 400° C. or higher to 700° C. or lower.

37. The method for manufacturing the semiconductor device according to claim 29, wherein the base substrate has a thermal expansion coefficient which is the same as or substantially the same as, or larger than a thermal expansion coefficient of the semiconductor substrate.

38. The method for manufacturing the semiconductor device according to claim 29, wherein the thermal expansion coefficient of the base substrate is 0.85 times to twice as high as the thermal expansion coefficient of the semiconductor substrate.

39. The method for manufacturing the semiconductor device according to claim 29, wherein a silicon substrate is used as the semiconductor substrate and a substrate having a thermal expansion coefficient ranging from $2.3 \times 10^{-6}$ to $5.0 \times 10^{-6}/°$ C. is used as the base substrate.

40. The method for manufacturing the semiconductor device according to claim 29, wherein a glass substrate is used as the base substrate.

41. The method for manufacturing the semiconductor device according to claim 40, wherein a surface of the glass substrate is polished.

42. The method for manufacturing the semiconductor device according to claim 40, wherein a mean surface roughness of the glass substrate is 0.3 nm or less

* * * * *